(12) United States Patent
Rubloff et al.

(10) Patent No.: US 12,094,721 B2
(45) Date of Patent: Sep. 17, 2024

(54) MULTI-LAYER SOLID-STATE DEVICES AND METHODS FOR FORMING THE SAME

(71) Applicant: University of Maryland, College Park, College Park, MD (US)

(72) Inventors: Gary W. Rubloff, Clarksville, MD (US); Sang Bok Lee, Clarksville, MD (US); Keith Gregorczyk, Washington, DC (US)

(73) Assignee: University of Maryland, College Park, College Park, MD (US)

( * ) Notice: Subject to any disclaimer, the term of this patent is extended or adjusted under 35 U.S.C. 154(b) by 1099 days.

(21) Appl. No.: 16/959,692

(22) PCT Filed: Jan. 3, 2019

(86) PCT No.: PCT/US2019/012180
§ 371 (c)(1),
(2) Date: Jul. 2, 2020

(87) PCT Pub. No.: WO2019/164588
PCT Pub. Date: Aug. 29, 2019

(65) Prior Publication Data
US 2021/0082715 A1    Mar. 18, 2021

Related U.S. Application Data

(60) Provisional application No. 62/613,861, filed on Jan. 5, 2018.

(51) Int. Cl.
*H01M 4/08*    (2006.01)
*C23C 14/04*    (2006.01)
(Continued)

(52) U.S. Cl.
CPC ............ *H01L 21/32* (2013.01); *C23C 14/042* (2013.01); *C23C 16/042* (2013.01);
(Continued)

(58) Field of Classification Search
CPC .... H01M 4/0423; H01M 4/0428; H01M 4/08; H01M 6/40; H01L 21/32;
(Continued)

(56) References Cited

U.S. PATENT DOCUMENTS 4,037,073 A    7/1977 Becker
5,349,217 A    9/1994 Boysel
(Continued)

FOREIGN PATENT DOCUMENTS

JP    2008-285690 A    11/2008
WO    WO 1999/030336 A1    6/1999

OTHER PUBLICATIONS

Pearse et al., "Three-dimensional Solid-State Lithium-Ion Batteries Fabricated by Conformal Vapor-Phase Chemistry," ACS Nano, 2018, 12: pp. 4286-4294. (34 pages).
(Continued)

*Primary Examiner* — Jane J Rhee
(74) *Attorney, Agent, or Firm* — RowanTree Law Group, PLLC; Frederick F. Rosenberger

(57) ABSTRACT

A solid-state device includes a substrate with a stack of constituent thin-film layers that define an arrangement of electrodes and intervening layers. The constituent layers can conform to or follow a non-planar surface of the substrate, thereby providing a 3-D non-planar geometry to the stack. Fabrication employs a common shadow mask moved between lateral positions offset from each other to sequentially form at least some of the layers in the stack, whereby layers with a similar function (e.g., anode, cathode, etc.) can be electrically connected together at respective edge regions. Wiring layers can be coupled to the edge regions for making electrical connection to the respective subset of layers, thereby simplifying the fabrication process. By appropriate selection and deposition of the constituent layers, the multi-
(Continued)

layer device can be configured as an energy storage device, an electro-optic device, a sensing device, or any other solid-state device.

36 Claims, 9 Drawing Sheets

(51) Int. Cl.
| | |
|---|---|
| *C23C 16/04* | (2006.01) |
| *H01L 21/02* | (2006.01) |
| *H01L 21/32* | (2006.01) |
| *H01L 21/3205* | (2006.01) |
| *H01L 49/02* | (2006.01) |
| *H01M 4/04* | (2006.01) |
| *H01M 6/40* | (2006.01) |
| *H01L 31/0224* | (2006.01) |
| *H01L 31/0445* | (2014.01) |
| *H01L 33/08* | (2010.01) |
| *H01L 33/38* | (2010.01) |
| *H10N 30/30* | (2023.01) |
| *H10N 30/50* | (2023.01) |

(52) U.S. Cl.
CPC .... *H01L 21/02636* (2013.01); *H01L 21/3205* (2013.01); *H01L 28/87* (2013.01); *H01M 4/0423* (2013.01); *H01M 4/0428* (2013.01); *H01M 4/08* (2013.01); *H01M 6/40* (2013.01); *H01L 31/022425* (2013.01); *H01L 31/0445* (2014.12); *H01L 33/08* (2013.01); *H01L 33/38* (2013.01); *H10N 30/302* (2023.02); *H10N 30/50* (2023.02)

(58) Field of Classification Search
CPC ........... H01L 21/02636; H01L 21/3205; H01L 28/87; H01L 31/0445; H01L 31/022425; H01L 30/302; H01L 30/50; H01L 33/08; H01L 33/38
See application file for complete search history.

(56) References Cited

U.S. PATENT DOCUMENTS

| | | | |
|---|---|---|---|
| 6,403,392 B1 | 6/2002 | Burrows et al. | |
| 6,413,285 B1 | 7/2002 | Chu et al. | |
| 6,597,086 B1 | 7/2003 | Boecking | |
| 7,211,348 B2 | 5/2007 | Wadley et al. | |
| 7,725,148 B2 | 5/2010 | Shah et al. | |
| 7,945,344 B2 | 5/2011 | Wang et al. | |
| 7,989,361 B2 | 8/2011 | Seon et al. | |
| 8,192,789 B2 | 6/2012 | Albano et al. | |
| 8,283,649 B2 | 10/2012 | Bratkovski et al. | |
| 8,377,792 B2 | 2/2013 | Hopper et al. | |
| 8,378,333 B2 | 2/2013 | Banerjee et al. | |
| 8,443,498 B2 | 5/2013 | Ha | |
| 8,597,722 B2 | 12/2013 | Albano et al. | |
| 8,691,016 B2 | 4/2014 | Sonoda et al. | |
| 8,722,505 B2 | 5/2014 | Hopper et al. | |
| 8,870,979 B2 * | 10/2014 | Bouillon | H01M 50/117 29/623.5 |
| 8,900,743 B2 | 12/2014 | Kim et al. | |
| 8,912,522 B2 | 12/2014 | Rubloff et al. | |
| 8,930,008 B2 | 1/2015 | Sastry et al. | |
| 9,127,344 B2 | 9/2015 | Chung et al. | |
| 9,249,502 B2 | 2/2016 | Albano et al. | |
| 9,303,315 B2 | 4/2016 | Albano et al. | |
| 9,368,772 B1 | 6/2016 | Chen et al. | |
| 9,458,532 B2 | 10/2016 | Sonoda et al. | |
| 9,602,073 B2 | 3/2017 | Grannen et al. | |
| 9,631,269 B2 | 4/2017 | Chung et al. | |
| 9,761,847 B2 | 9/2017 | Chen et al. | |
| 10,032,565 B2 | 7/2018 | O'Phelan et al. | |
| 10,032,569 B2 | 7/2018 | Rubloff et al. | |
| 10,090,566 B2 | 10/2018 | Christensen et al. | |
| 10,109,887 B1 | 10/2018 | Bhardwaj et al. | |
| 2003/0042043 A1 | 3/2003 | Clevenger et al. | |
| 2004/0058237 A1* | 3/2004 | Higuchi | C23C 14/30 429/162 |
| 2009/0325063 A1 | 12/2009 | Albano et al. | |
| 2010/0189837 A1 | 7/2010 | Forrest et al. | |
| 2011/0065282 A1 | 3/2011 | Yan et al. | |
| 2011/0217578 A1 | 9/2011 | Albano et al. | |
| 2012/0055633 A1 | 3/2012 | Kim et al. | |
| 2012/0058280 A1 | 3/2012 | Chung et al. | |
| 2012/0058380 A1 | 3/2012 | Wang et al. | |
| 2012/0135292 A1 | 5/2012 | Buckingham et al. | |
| 2013/0220546 A1 | 8/2013 | Kim et al. | |
| 2014/0099538 A1 | 4/2014 | Johnson et al. | |
| 2015/0030909 A1 | 1/2015 | Ihlefeld et al. | |
| 2015/0072215 A1 | 3/2015 | Kim et al. | |
| 2015/0100146 A1 | 4/2015 | Sastry et al. | |
| 2017/0356078 A1 | 12/2017 | Chung et al. | |
| 2018/0138469 A1 | 5/2018 | Chen et al. | |
| 2018/0248163 A1 | 8/2018 | Kim et al. | |

OTHER PUBLICATIONS

International Search Report and Written Opinion, mailed Aug. 26, 2019, in International Application No. PCT/US2019/012180.

* cited by examiner

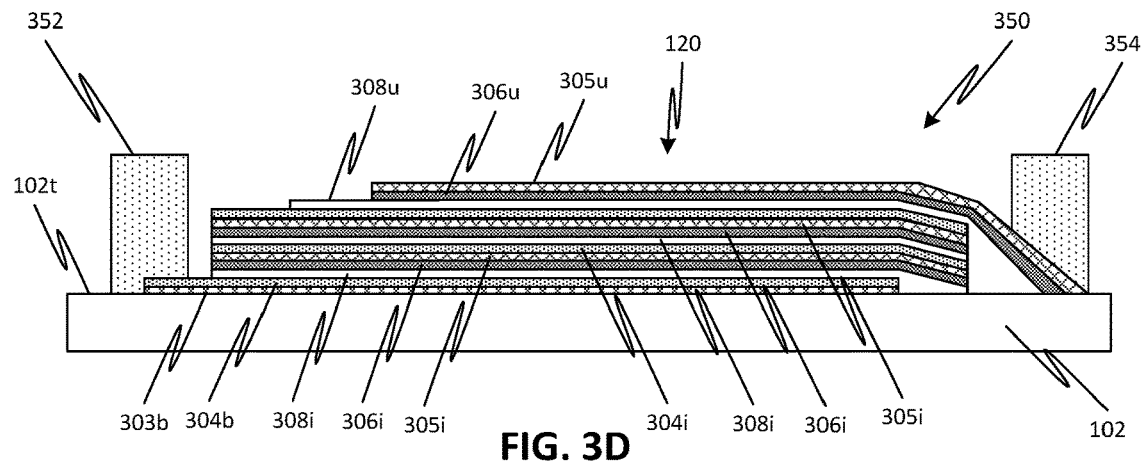
FIG. 3D
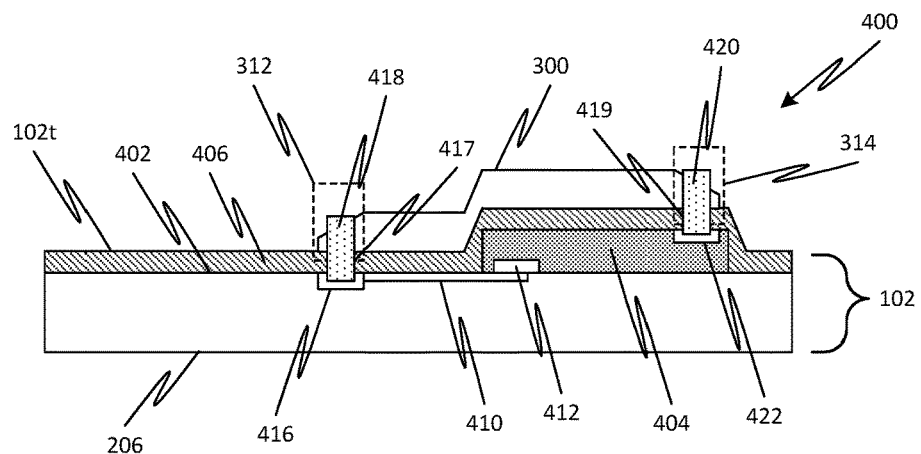
FIG. 4A
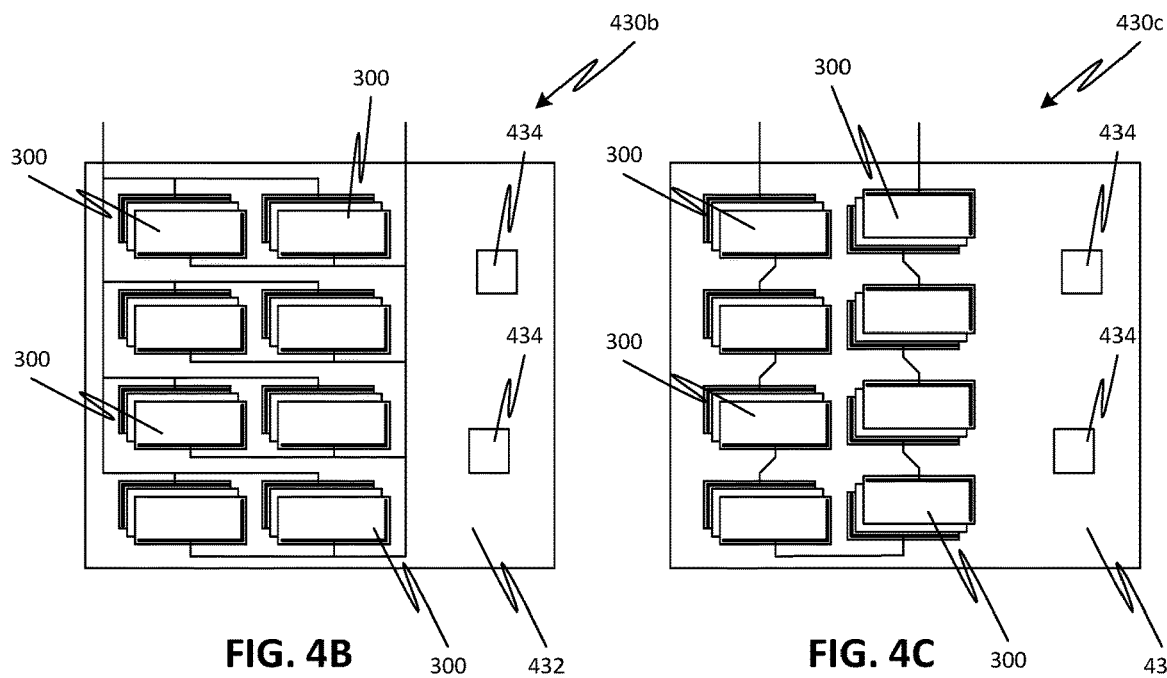
FIG. 4B
FIG. 4C

MULTI-LAYER SOLID-STATE DEVICES AND METHODS FOR FORMING THE SAME

CROSS-REFERENCE TO RELATED APPLICATIONS

The present application claims the benefit of U.S. Provisional Application No. 62/613,861, filed Jan. 5, 2018, which is hereby incorporated by reference herein in its entirety.

STATEMENT REGARDING FEDERALLY SPONSORED RESEARCH

This invention was made with government support under DE-SC0001160 awarded by the Department of Energy. The government has certain rights in the invention.

FIELD

The present disclosure relates generally to solid-state devices, and more particularly, to multi-layer solid-state devices with offset electrodes and methods for forming the same.

SUMMARY

Embodiments of the disclosed subject matter include multilayer solid-state devices and a method for fabricating such devices. The solid-state device includes a substrate with a stack of constituent thin-film layers that define an arrangement of electrodes and intervening layers. The constituent layers can conform to or follow a non-planar surface of the substrate, thereby providing a 3-D non-planar geometry to the stack. Among other substantial benefits, this non-planar surface of the substrate offers a higher surface area as compared to planar substrates, which translates into enhanced performance since there is more room for active functional structures.

Fabrication can employ a common shadow mask moved between lateral positions offset from each other to sequentially form at least some of the layers in the stack, whereby layers with a similar function (e.g., anode, cathode, etc.) can be electrically connected together at respective edge regions. Wiring layers can be coupled to the edge regions for making electrical connection to the respective subset of layers, thereby simplifying the fabrication process. By appropriate selection and deposition of the constituent layers, the multi-layer device can be configured as an energy storage device, such as a battery or capacitor, an electro-optic device, such as a light-emitting diode or solar cell, a sensing device, such as a piezoelectric sensor, or any other solid-state device.

In one or more embodiments, a method of forming a multi-layer solid-state device comprises (A1) depositing at least a portion of a first electrode over a first surface of a substrate using a first shadow mask in a first position with respect to the substrate. The method further comprises (E1) after (A1), displacing at least one of the substrate and the first shadow mask with respect to the other of the substrate and the first shadow mask, such that the first shadow mask is in a second position with respect to the substrate, and depositing a first intervening layer over the first electrode using the first shadow mask in the second position. The first position can be offset from the second position in at least one dimension in plan view.

The method further comprises (C1) after (E1), displacing at least one of the substrate and the first shadow mask with respect to the other of the substrate and the first shadow mask, such that the first shadow mask is in a third position with respect to the substrate, and depositing at least a portion of a second electrode over the first intervening layer using the first shadow mask in the third position. The second position can be offset from the third position in at least one dimension in plan view. The method further comprises (E2) after (C1), displacing at least one of the substrate and the first shadow mask with respect to the other of the substrate and the first shadow mask, such that the first shadow mask is in a fourth position with respect to the substrate, and depositing a second intervening layer over the second electrode using the first shadow mask in the fourth position. The fourth position can be aligned with the second position in plan view.

The method further comprises (A2) after (E2), displacing at least one of the substrate and the first shadow mask with respect to the other of the substrate and the first shadow mask, such that the first shadow mask is in a fifth position with respect to the substrate, and depositing at least a portion of a third electrode over the second intervening layer using the first shadow mask in the fifth position. The fifth position can be aligned with the first position in plan view. At least a portion of the first surface of the substrate is non-planar.

In one or more embodiments, a method comprises forming a first electrode over a substrate, forming a first layer over the first electrode and offset from the first electrode in at least one dimension in plan view, forming a second electrode over the first layer, forming a second layer over the second electrode and aligned with the first layer in plan view, and forming a third electrode over the second layer. The second electrode can be offset from the first layer and the first electrode in at least one dimension in plan view. The third electrode can be aligned with the first electrode in plan view. A surface of the substrate, over which the first electrode is formed, can be non-planar.

In one or more embodiments, a multi-layer solid-state device comprises a substrate, a first electrode, a first intervening layer, a second electrode, a second intervening layer, and a third electrode. The substrate can have a non-planar surface. The first electrode can be formed over the non-planar surface. The first intervening layer can be formed over the first electrode. The second electrode can be formed over the first intervening layer. The second intervening layer can be formed over the second electrode. The third electrode can be formed over the second intervening layer.

The first electrode can be aligned with the third electrode in plan view. The first intervening layer can be aligned with the second intervening layer in plan view. The first and third electrodes can be offset in at least one dimension from the first and second intervening layers in plan view. The second electrode can be offset in at least one dimension from the first and third electrodes and from the first and second intervening layers in plan view.

Objects and advantages of embodiments of the disclosed subject matter will become apparent from the following description when considered in conjunction with the accompanying drawings.

BRIEF DESCRIPTION OF DRAWINGS

Embodiments will hereinafter be described with reference to the accompanying drawings, which have not necessarily been drawn to scale. Where applicable, some elements may be simplified, exaggerated, or otherwise not illustrated in order to assist in the illustration and description of underlying features. Throughout the figures, like reference numerals denote like elements.

FIG. 3D is a cross-sectional view of another exemplary layer arrangement for a multi-layer solid-state battery, according to one or more embodiments of the disclosed subject matter.

FIG. 4A is a simplified cross-sectional view illustrating a multi-layer solid-state device integrated with an electronic device, according to one or more embodiments of the disclosed subject matter.

FIG. 4B is a simplified plan view of a plurality of multi-layer solid-state devices formed on a common substrate and wired in parallel, according to one or more embodiments of the disclosed subject matter.

FIG. 4C is a simplified plan view of a plurality of multi-layer solid-state devices formed on a common substrate and wired in series, according to one or more embodiments of the disclosed subject matter.

DETAILED DESCRIPTION

Figure 1A:
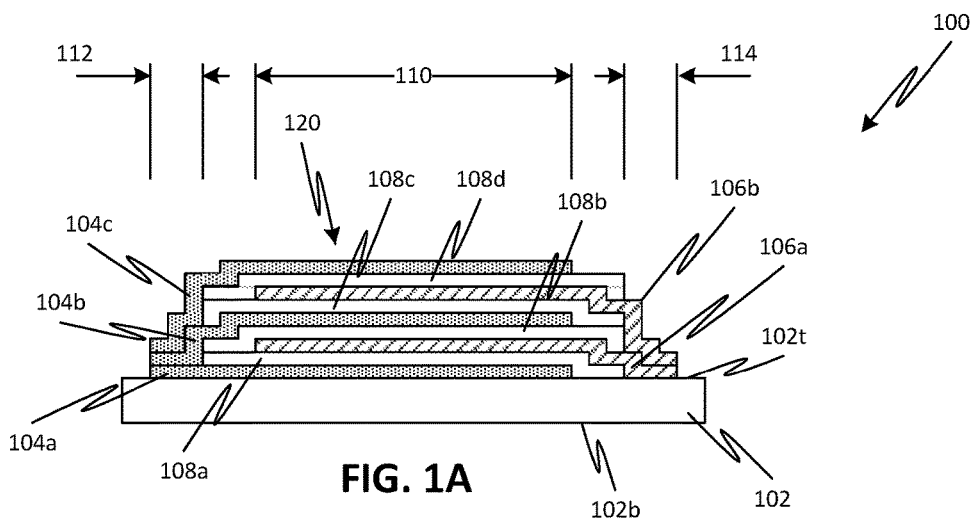
FIG. 1A is a cross-sectional view of an exemplary layer arrangement for a multi-layer solid-state device, according to one or more embodiments of the disclosed subject matter.

In embodiments, a multi-layer solid-state device 100 includes a substrate 102 with a stack 120 of thin-film layers 104-108 formed on an upper surface 102*t* of the substrate 102, as illustrated in FIG. 1A. A first electrode 104*a* (Type I) is formed over the surface 102*t* of the substrate 102. An intervening layer 108*a* is formed on and shifted laterally with respect to the first electrode 104*a*. An upper surface of the first electrode 104*a* is thus exposed from the intervening layer 108*a* at a first edge region 112, while a portion of the intervening layer 108*a* on an opposite side from the first edge region 112 extends past the first electrode 104*a* to contact the upper surface of the substrate 102. A second electrode 106*a* (Type II) is formed on and shifted laterally with respect to the intervening layer 108*a*. The upper surface of the first electrode 104*a* thus remains exposed within the first edge region 112, while a portion of the second electrode 106*a* extends past the intervening layer 108*a* to contact the upper surface 102*t* of the substrate 102. The substrate 102 may be substantially insulating such that electrodes 104*a* and electrodes 106*a* are electrically insulating from each other despite being in contact with the upper surface 102*t*.

Alternatively or additionally, an insulating layer (not shown) may otherwise be part of and define the upper surface 102*t* of the substrate 102.

Another intervening layer 108*b* is formed on and shifted laterally with respect to the second electrode 106*a*. The intervening layer 108*b* is substantially aligned with the underlying intervening layer 108*a*. An upper surface of the second electrode 106*a* is thus exposed from intervening layer 108*b* at a second edge region 114, while a portion of the intervening layer 108*b* on an opposite side from second edge region 114 extends past the second electrode 106*a* to contact an upper surface of the underlying intervening layer 108*a*. The intervening layer 108*b* terminates before first edge region 112, such that the upper surface of the first electrode 104*a* remains exposed within the first edge region 112.

A third electrode 104*b* (Type I) is formed on and shifted laterally with respect to the intervening layer 108*b*. The third electrode 104*b* is of the same type as the first electrode 104*a* and is shifted toward the first edge region 112 so as to be substantially aligned with the underlying first electrode 104*a*. A portion of the third electrode 104*b* extends past the intervening layer 108*b* to contact an upper surface of the underlying first electrode 104*a* in the first edge region 112. The first electrode 104*a* and third electrode 104*b* are thus electrically connected together by virtue of the offset layer arrangement.

Another intervening layer 108*c* is formed on and shifted laterally with respect to the third electrode 104*b*. The intervening layer 108*c* is substantially aligned with the underlying intervening layer 108*b*. An upper surface of the third electrode 104*b* is thus exposed from the intervening layer 108*c* at the first edge region 112, while a portion of the intervening layer 108*c* on an opposite side from the first edge region 112 extends past the third electrode 104*b* to contact an upper surface of intervening layer 108*b*.

A fourth electrode 106*b* (Type II) is formed on and shifted laterally with respect to intervening layer 108*c*. The fourth electrode 106*b* is of the same type as the second electrode 106*a* and is shifted toward the second edge region 114 so as to be substantially aligned with the underlying second electrode 106*a*. The upper surface of the third electrode 104*b* thus remains exposed within the first edge region 112, while a portion of the fourth electrode 106*b* extends past the intervening layer 108*c* to contact an upper surface of the underlying second electrode 106*a* in the second edge region 114. The second electrode 106*a* and fourth electrode 106*b* are thus electrically connected together by virtue of the offset layer arrangement.

Another intervening layer 108*d* is formed on and shifted laterally with respect to the fourth electrode 106*b*. The intervening layer 108*d* is substantially aligned with the underlying intervening layer 108*c*. An upper surface of the fourth electrode 106*b* is thus exposed from intervening layer 108*d* at the second edge region 114, while a portion of the intervening layer 108*d* on an opposite side from second edge region 114 extends past the fourth electrode 106*b* to contact an upper surface of the underlying intervening layer 108*c*. The intervening layer 108*d* terminates before first edge region 112, such that the upper surface of the third electrode 104*b* remains exposed within the first edge region 112.

A fifth electrode 104*c* (Type I) is formed on and shifted laterally with respect to the intervening layer 108*d*. The fifth electrode 104*c* is of the same type as the first and third electrodes 104*a*, 104*b* and is shifted toward the first edge region 112 so as to be substantially aligned with the underlying first electrode 104*a*. A portion of the fifth electrode 104*c* extends past the intervening layer 108*d* to contact an upper surface of the underlying third electrode 104*b* in the first edge region 112. The first electrode 104*a*, third electrode 104*b*, and fifth electrode 104*c* are thus electrically connected together by virtue of the offset layer arrangement.

The combination of first electrode 104*a*, intervening layer 108*a*, and second electrode 106*a* forms a first of many sub-devices in the stack 120 that are connected together in parallel. A second sub-device is comprised of the third electrode 104*b*, intervening layer 108*b*, and the second electrode 106*a*, with the second electrode 106*a* being shared by the first and second sub-devices. In each sub-device, the overlapping area 110 in plan view between the Type I and Type II electrodes can define an active area of the respective sub-device. The active area 110 is disposed between the first edge region 112 and second edge region 114, and is separated from each edge region 112, 114 by portions of the intervening layers 108*a*-108*d*.

Additional layers forming additional sub-devices can be added to the stack in a similar manner ad infinitum (or at least until a desired or practical number of sub-devices in the stack 120 has been achieved). For example, a third sub-device can be formed by fourth electrode 106*b*, intervening layer 108*c*, and third electrode 104*c* (with the third electrode 104*c* being shared by the second and third sub-devices) and has a similar configuration as the first sub-device. A fourth sub-device can be formed by fifth electrode 104*c*, intervening layer 108*d*, and fourth electrode 106*b* (with the fourth electrode 106*b* being shared by the third and fourth sub-devices) and has a similar configuration as the second sub-device.

Although four sub-devices are described in FIG. 1A, embodiments of the disclosed subject matter are not limited thereto. Rather, additional or fewer sub-devices are also possible according to one or more embodiments of the disclosed subject matter. Moreover, although each sub-device is indicated as having three layers (i.e., a pair of electrodes and an intervening layer), alternative constructions are also possible, for example, with each sub-device being comprised of more than three layers, such as when the electrodes contain multiple sub-layers (e.g., one or more anodic/cathodic electrode layers and a corresponding current collector layer) or when the intervening layer contains multiple sub-layers (e.g., semiconductor layers to form a p-n junction). Furthermore, additional layers may be disposed between sub-devices within the stack, for example, by providing one or more serially-connected sub-devices within the stack, such as described below with respect to FIG. 3D. Accordingly, embodiments of the disclosed subject matter are not limited to the specific arrangement for parallel-connected sub-devices illustrated in FIG. 1A.

As FIG. 1A illustrates, the constituent layers of the stack 120 can be located based on their respective functions. Accordingly, layers having the same function can be aligned with each other, but offset from other layers with differing functions, so as to be directly connected together in situ (i.e., during formation of the multiple layers) despite being separated from each other in a thickness direction of the stack 120 (i.e., perpendicular to the upper surface 102*t* of the substrate 102). Thus, the first, third, and fifth electrodes 104*a*-104*c*, which are all Type I electrodes, are electrically connected together within first edge region 112 by virtue of their direct surface contact. Similarly, the second and fourth electrodes 106*a*-106*c*, which are all Type II electrodes, are electrically connected together within second edge region 114 by virtue of their direct surface contact. The intervening layers 108*a*-108*d* may be similarly aligned and connected together, thereby ensuring that the Type I and Type II electrodes do not otherwise contact each other. The respective physical connections between Type I electrodes and Type II electrodes can simplify the wiring of a number of sub-devices formed by the Type I and Type II electrodes, which may otherwise have been unwieldy or involve more complicated or expensive fabrication techniques.

In some embodiments, the constituent layers of the stack 120 all have substantially the same shape (i.e., geometry and dimensions) in plan view. Such a configuration may facilitate the use of a common shadow mask for each of the constituent layers. For example, the Type I electrodes 104a-104c, intervening layers 108a-108d, and Type II electrodes 106a-106b all have the same rectangular shape in plan view. In some embodiments, the layers can be offset from each other in one dimension, for example, as shown in the plan view of FIG. 1B. The first edge region 112 and the second edge region 114 are thus rectangular-shaped regions extending in a direction orthogonal to the direction 122 of offset and on opposite sides of the active area 110, which is also rectangular. Alternatively or additionally, the layers can be offset from each other in two dimensions (e.g., $l_x$ and $l_y$), for example, as shown in the plan view of FIG. 1C. The first edge region 112 and second region 114 are thus L-shaped polygons, with one portion extending along a first edge of the intervening layer 108a and a second portion extending along a second edge of the intervening layer 108a orthogonal to the first edge. In some embodiments, the constituent layers of the stack may have substantially the same geometric shape but differ slightly in terms of dimension in plan view, for example, due to dimensional differences arising from deposition of different materials using the common shadow mask.

Figure 1B:
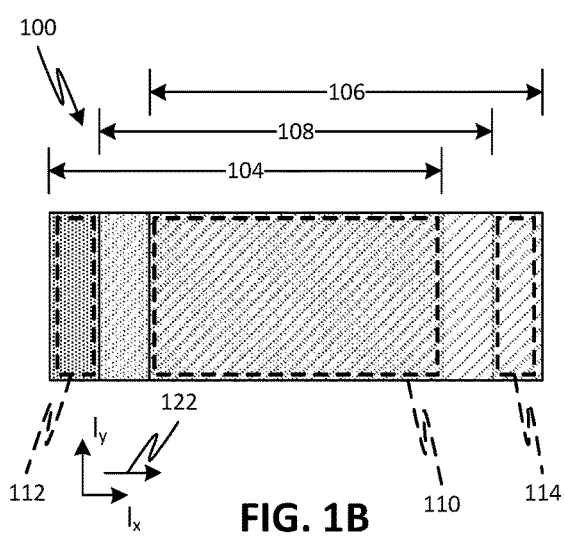
FIG. 1B is a plan view of an exemplary rectangular layer arrangement for a multi-layer solid-state device having a one-dimensional offset, according to one or more embodiments of the disclosed subject matter.
Figure 1C:
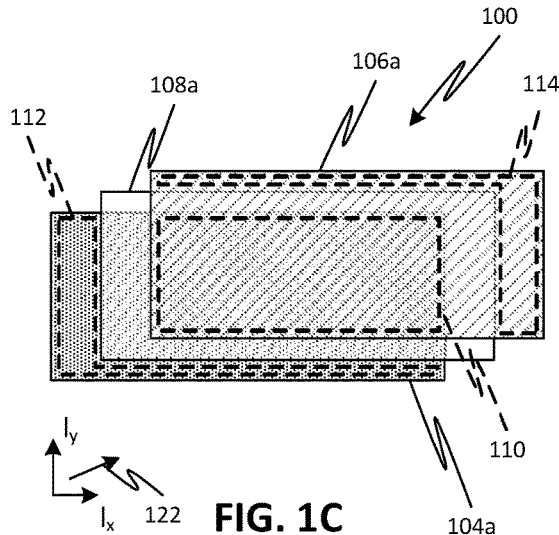
FIG. 1C is a plan view of an exemplary rectangular layer arrangement for a multi-layer solid-state device having a two-dimensional offset, according to one or more embodiments of the disclosed subject matter.
Figure 1D:
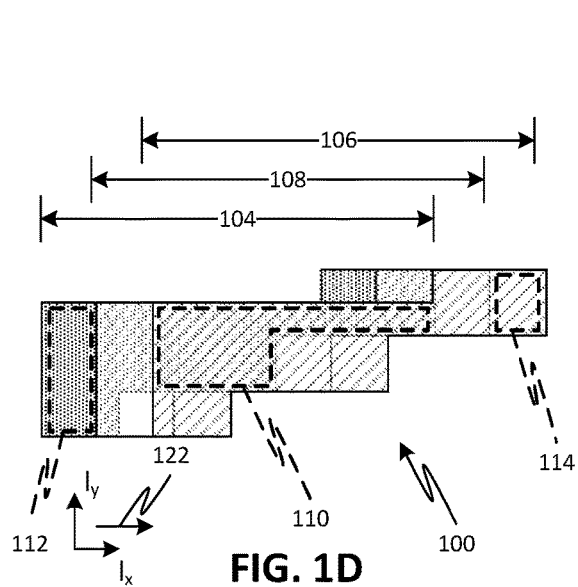
FIG. 1D is a plan view of an exemplary custom-shaped layer arrangement for a multi-layer solid-state device having a one-dimensional offset, according to one or more embodiments of the disclosed subject matter.
Figure 1E:
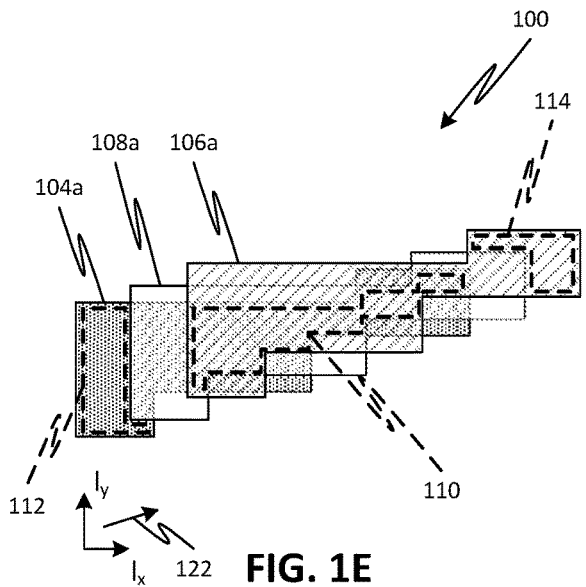
FIG. 1E is a plan view of an exemplary custom-shaped layer arrangement for a multi-layer solid-state device having a two-dimensional offset, according to one or more embodiments of the disclosed subject matter.

Although FIGS. 1B-1C illustrate a rectangular shape for the layers, embodiments of the disclosed subject matter are not limited thereto. Rather, the selection of a rectangular shape is arbitrary, and the constituent layers can have different shapes and sizes (i.e., form factors) from a simple rectangle. For example, FIGS. 1D-1E illustrate a more complex polygonal shape for the constituent layers of the device stack, with layers being offset in one dimension or two dimensions, respectively. Other shapes beyond those illustrated in FIGS. 1B-1E are also possible according to one or more contemplated embodiments. In particular, the constituent layers can have any shape, whether regular, irregular, or curved. In some embodiments, the shape of the layers may be selected to accommodate a particular application or to accommodate a particular available area defined by other structures or components (e.g., circuit elements, mounting points, electrical traces, etc.) on the substrate 102.

Although illustrated as flat in FIG. 1A, the upper surface 102t of the substrate 102 is actually non-planar (i.e., not flat). For example, the substrate 102 can include projections and/or recesses, with the top, bottom, and side surfaces of these projections and/or recesses defining the upper surface 102t of the substrate 102, over which the stack 120 of layers 104a-108d is formed. The projections and/or recesses defining the upper surface of the substrate increase available surface area for coverage by the stack of layers forming the multi-layer device, and may also provide various benefits with respect to fabrication and/or device cost, such as but not limited to, faster deposition due to the enhanced surface area.

Figure 2A:
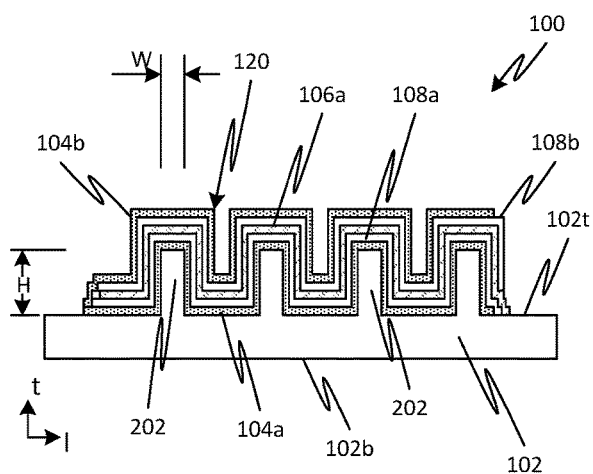
FIG. 2A is a cross-sectional view of an exemplary layer arrangement for a multi-layer solid-state device formed on a non-planar substrate having projections, according to one or more embodiments of the disclosed subject matter.
Figure 2B:
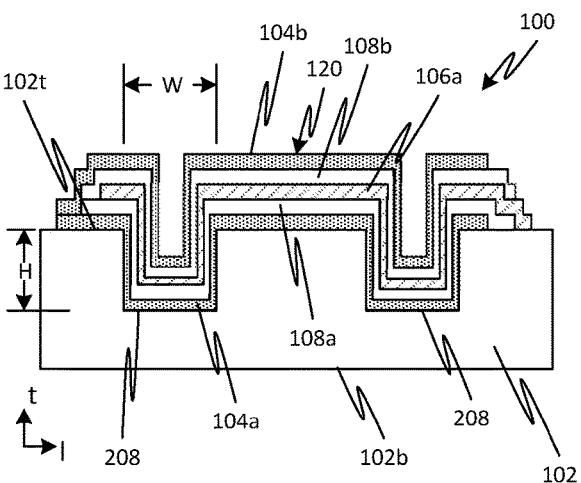
FIG. 2B is a cross-sectional view of an exemplary layer arrangement for a multi-layer solid-state device formed on a non-planar substrate having recesses, according to one or more embodiments of the disclosed subject matter.
Figure 2C:
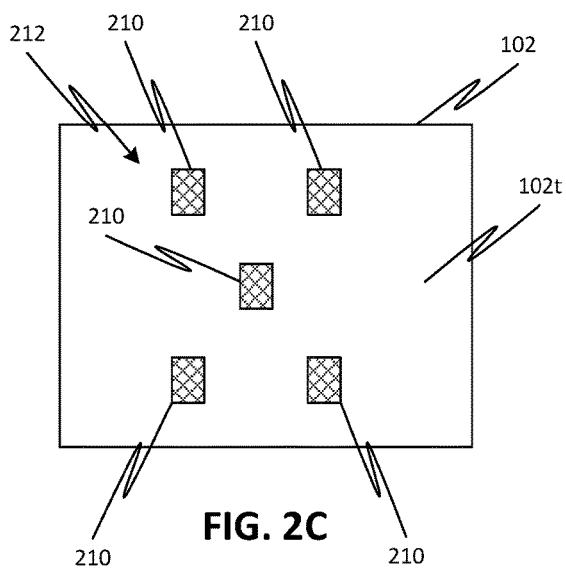
FIG. 2C is a plan view of a non-planar substrate having a plurality of pillars or pores, according to one or more embodiments of the disclosed subject matter.
Figure 2D:
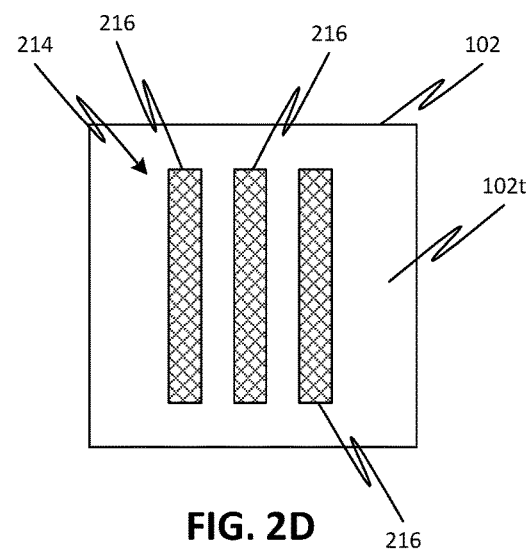
FIG. 2D is a plan view of a non-planar substrate having a plurality of ridges or trenches, according to one or more embodiments of the disclosed subject matter.

For example, FIG. 2A illustrates a configuration for substrate 102 with multiple projections 202, where the non-planar upper surface 102t of the substrate 102 is defined by the top and side surfaces of the projections 202 as well as the top surface of the substrate 102 between or surrounding the projections 202. In another example, FIG. 2B illustrates a configuration for substrate 102 with multiple recesses 208, where the non-planar upper surface 102t of the substrate 102 is defined by the bottom and side surfaces of the recesses 208 as well as the top surface of the substrate 102 between or surrounding the recesses 208. Of course, it is also possible that substrate 102 can include both projections 202 and recesses 208, for example, by combining the structures of FIGS. 2A-2B.

Various shapes for the projections 202 and/or recesses 208 are possible. For example, the projections 202 can have dimensions in plan view that are roughly the same so as to form a pillar (e.g., as with feature 210 of FIG. 2C), or can have one dimension greater than the other in plan view so as to form a ridge (e.g., an elongated pillar, as with feature 216 of FIG. 2D). Similarly, the recess 208 can have dimensions in plan view that roughly the same so as to form a pore (e.g., as with feature 210 in FIG. 2C), or can have one dimension greater than the other in plan view to form a trench (e.g., an elongated pore, as with feature 216 of FIG. 2D). Multiple surface features, whether projections 202 or recesses 208, can be provided across the substrate 102, for example, as a two-dimensional array 212 or as a one-dimensional array 216. Shapes and patterns for the projections 202 and recesses 208 beyond those illustrated in FIGS. 2A-2D are also possible according to one or more contemplated embodiments. For example, the pattern of projections 202 and/or recesses 208 across the substrate 102 may be random or arbitrary rather than following a regular array.

The projections 202 and/or recesses 208 of the substrate 102 thus define a three-dimensional profile for surface 102t, with some portions of the surface 102t being at different levels. Each of the layers 104a-108d (although, for clarity purposes, only a portion of the layer stack 120 of FIG. 1A is illustrated in FIGS. 2A-2B) is formed over the upper surface 102t such that the layers 104a-108d conform to or follow the non-planar profile of the substrate surface 102t. The projections 202 and/or recesses 208 of the surface 102t each have an aspect ratio (i.e., of height, H, in a thickness direction, t, to a width, W, in a lateral direction, l) of at least 0.5 to 1.

In some embodiments, the layers formed over portions of surface 102t at one level may exhibit different properties as compared to those layers formed over portions of surface 102t at another level. For example, when a physical vapor deposition method is used to form layers 104a-108d, respective thicknesses of layers at higher levels (e.g., between adjacent recesses 208 or at the top of projections 202) may be greater than respective thicknesses of layers at lower levels (e.g., at the bottom of recesses 208 or between adjacent projections 202). When the layers are constructed to form a battery, these differences in layer thicknesses may yield higher power characteristics for the lower level layers and higher energy density characteristics for the higher level layers. Alternatively, when a conformal deposition method (e.g., chemical vapor deposition) is used to form layers 104a-108d, variations in the respective thicknesses of layers may be avoided.

Figure 2E:
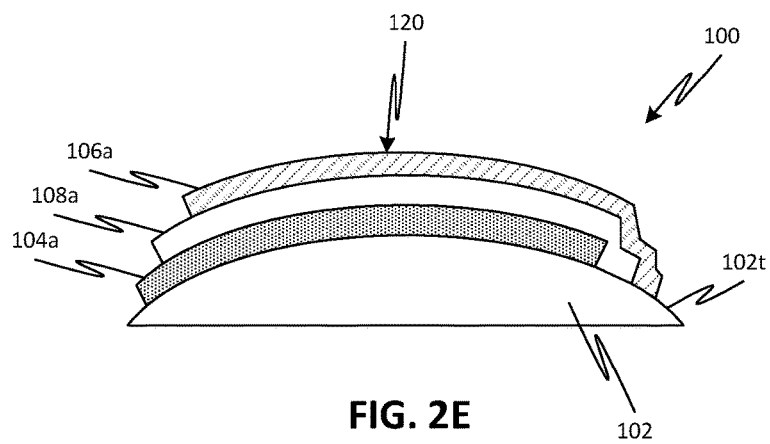
FIG. 2E is a cross-sectional view of an exemplary layer arrangement for a multi-layer solid-state device formed on a non-planar substrate having a curved surface, according to one or more embodiments of the disclosed subject matter.

In some embodiments, the substrate can have a curved upper surface in addition to, or in place of, projections and/or recesses. For example, FIG. 2E illustrates a configuration for substrate 102 with an upper surface 102t having a non-zero curvature. Each of the layers 104a-108d (although, for clarity purposes, only a portion of the layer stack 120 of FIG. 1A is illustrated in FIG. 2E) is formed over substrate 102 such that the layers conform to or follow the curved profile of the substrate surface 102t. In an embodiment, the substrate 102 can be a biomedical implant having a surface over which one or more multi-layer solid-state devices 100 is formed to act as a sensor and/or battery, for example, to detect in vivo forces acting on the surface of the implant device or to provide power to the implant device.

A material and structure of the substrate 102 can be selected based on a particular application for multi-layer solid-state device 100. For example, the substrate 102 may be formed of a substantially insulating material, such as semiconductor or dielectric material, to avoid electrically connecting layers 104a and 106a through the substrate 102. The substrate 102 can be rigid or flexible. In some embodiments, the substrate 102 can have a back surface 102b that follows the profile of the upper surface 102t. For example, the substrate 102 may be a molded scaffold, such as a convoluted aluminum foil. In some embodiments, the substrate 102 may be formed of a material that acts as one of the electrodes 104 or 106 of the stack 120, in which case the layer arrangement of the stack 120 is modified to account for the additional electrode. For example, the substrate 102 may be formed of a solid or thin-film cathode patterned to form a three-dimensional topography. Alternatively or additionally, the substrate 102 and/or a surface geometry thereof may be formed by one or more of anodization of aluminum, silicon, or other materials to form nanopores, patterning by dry anisotropic etching, nanowire growth, and folding of thin foils.

Figure 3A:
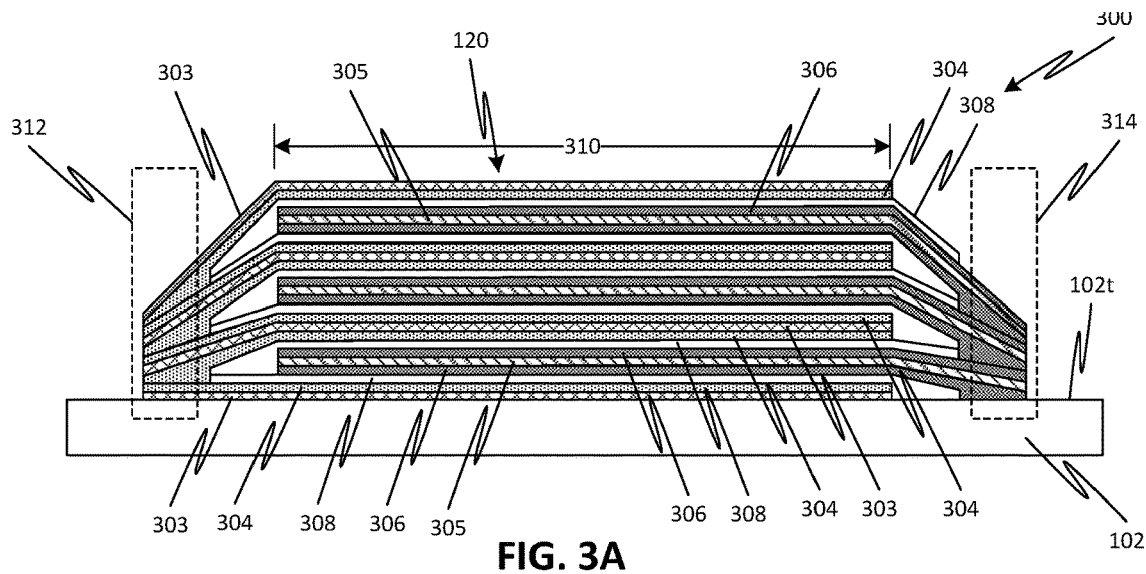
FIG. 3A is a cross-sectional view of an exemplary layer arrangement for a multi-layer solid-state battery, according to one or more embodiments of the disclosed subject matter.

Similarly, the materials and structure of the electrode and intervening layers can be selected based on a particular application for multi-layer solid-state device 100. For example, FIG. 3A illustrates a configuration for the solid-state device as a multi-battery 300. However, the configuration of FIG. 3A is merely an example configuration for when the device is constructed as a multi-battery. Other configurations are also possible. For example, when the device is constructed as a capacitor, the electrodes may be formed of electrically-conductive materials while the intervening layers may be formed of an insulating dielectric. In another example, when the device is constructed as an electro-optic device, the electrodes may be formed of optically-transparent, electrically-conductive materials while the intervening layers may be formed of semiconductor layers forming a p-n junction. In still another example, when the device constructed as a sensing device, the electrodes may be formed of electrically-conductive materials while the intervening layers may be formed of a piezo-electric material. Material compositions other than those specifically discussed above for the constituent layers of the stack 120 in order to form a particular solid-state device 100 of FIG. 1A will be readily apparent to one of ordinary skill in the art.

In the battery configuration of FIG. 3A, Type I electrodes 104 can be formed by anodic electrode layers 304 and anode current collector layers 303, Type II electrodes 106 can be formed by cathodic electrode layers 306 and cathode current collector layers 305, and the intervening layers 108 can be formed by solid electrolyte layers 308. Similar to FIG. 1A, the layers having different functions are offset with respect to each other, such that anodic electrode layers 304 (and corresponding current collectors 303) are formed in electrical contact with each other in edge region 312, while cathodic electrode layers 306 (and corresponding current collectors 305) are formed in electrical contact with each other in opposite edge region 314.

Each set of anode current collector 303, anodic electrode layer 304, solid electrolyte 308, cathodic electrode layer 306, and cathode current collector 305 that are adjacent to each other in the stack form a single thin-film battery of the device 300, with the overlapping area 310 in plan view of the anodic electrode layer 304 and cathodic electrode layer 306 defining an active area of each battery. For example, FIG. 3A illustrates six batteries stacked together and wired in parallel. Layers 303-308 may be considered thin-films, i.e., having a thickness less than 1 µm. For example, each of the layers may have a thickness of 30-80 nm, with current collectors 303, 305 having a thickness of 30 nm, anodic electrode layers 304 having a thickness of 40 nm, cathodic electrode layers 306 having a thickness of 80 nm, and electrolyte layers 308 having a thickness of 50 nm.

Adjacent batteries in the stack can share a current collector, such that the respective electrode is constituted by a pair of anodic or cathodic electrode layers sandwiching the current collector layer. Electrodes at an end of the stack 120, e.g., the lowermost electrode adjacent the substrate 102 or an uppermost electrode of the stack may omit one of the pair of anodic or cathodic electrode layers, for example, such that the respective current collector is adjacent to the substrate 102 or is exposed at the top of the stack 120. In FIG. 3A, the anode current collector 303 is exposed as part of the uppermost electrode layer, and another anode current collector 303 is contacts the substrate 102 as part of the lowermost electrode layer. However, the illustrated configuration represents only one potential arrangement of the layers, and other arrangements are also possible. For example, the cathode current collector 305 may be the first layer on the substrate 102 or the uppermost layer of the stack 120.

The anodic electrode layers 304, the cathodic electrode layers 306, and solid electrolyte layers 308 all have a similar shape in plan view, as defined by a common shadow mask pattern used to form the offset layers. In some embodiments, the anode current collector 303 can have the same shape as and be aligned with the anodic electrode layers 304, and/or the cathode current collector 305 can have the same shape as and be aligned with the cathodic electrode layers 306. Thus, the same shadow mask pattern (e.g., of the same shadow mask or identical patterns on different shadow masks) can be used to form each of the layers 303-308 of the multi-battery stack 120 by simply shifting the shadow mask pattern laterally (and vertically to accommodate increasing layer thicknesses) and changing source material for deposition. In other embodiments, the anode current collector 303 and/or the cathode current collector 305 can have a different pattern or shape from their corresponding electrode layers 304, 306, in which case, a second shadow mask pattern (e.g., on the same shadow mask or a different pattern on different shadow masks) can be used to form the current collectors 303 and/or 305.

The offset arrangement of layers allows for direct contact between the anodic electrode layers 304 and anode current collectors 303 of adjacent batteries within the stack 120 at anode contact region 312 (similar to first edge region 112). The offset arrangement also allows for direct contact between the cathodic electrode layers 306 and cathode current collectors 306 of adjacent batteries within the stack at cathode contact region 314 (similar to second edge region 114). As a result, the batteries within the stack are connected together in parallel in situ. Electrical contact between the electrodes structures is good, involving only the thickness of the thin layers of electrode materials between accompanying current collector layers, which provides for fast electron transport to the active battery region 310, thereby enabling high power.

Figure 3B:
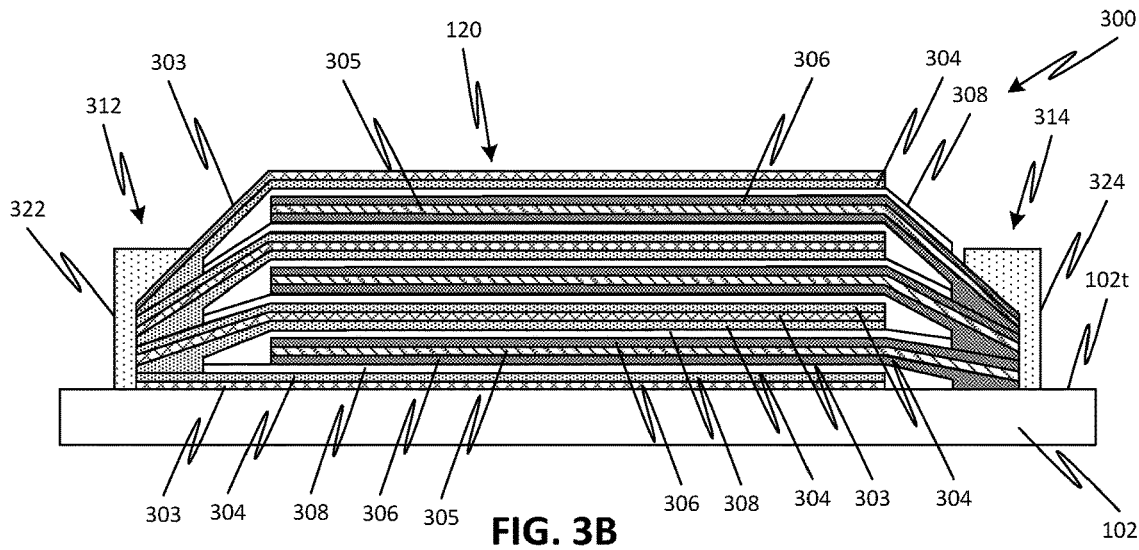
FIG. 3B is a cross-sectional view illustrating a first exemplary arrangement for wiring layers for the multi-layer solid-state battery of FIG. 3A.

Moreover, the offset arrangement of layers exposes the uppermost electrodes—the anode current collector 303 and the cathodic electrode layer 306—while simultaneously being in contact with the underlying layers. Electrical contact can thus be made to the exposed electrodes for wiring to connect the multi-battery stack to other devices. For example, an anode wiring layer 322 can be formed over the uppermost electrode (i.e., anode current collector 303) in the anode contact region 312 while a cathode wiring layer 324 can be formed over the uppermost electrode (i.e., cathodic electrode layer 306) in the cathode contact region 314, as illustrated in FIG. 3B. The anode wiring layer 322 and/or the cathode wiring layer 324 can connect to other devices on the same substrate (e.g., for wiring different battery stacks together in series or parallel, as in FIG. 4B), to terminals of a housing for making electrical contact to external devices (e.g., when the multi-battery is contained in a battery housing with electrical terminals), or to otherwise bring cathode and anode connections to accessible locations for connection to other circuits.

The contact area between the wiring layer and the underlying electrode layers may be substantially larger (e.g., at least two orders of magnitude) than the respective thickness of each electrode layer. For example, while anodic electrode layers 304, cathodic electrode layers 306, anode current collector layers 303, and cathode current collector layers 305 each have a thickness on the order of tens of nanometers (e.g., 30-80 nm), each wiring layer 322, 324 extends over a much greater dimension (e.g., ~1 mm in plan view) in the respective contact region 312, 314.

In some embodiments, the anode wiring layer 322 and/or the cathode wiring layer 324 can be formed using another shadow mask (e.g., different from the one used to form the different battery layers 303-308) to deposit electrically-conductive material (e.g., copper) on the respective contact regions 312, 314. In some embodiments, deposition of the anode and cathode wiring layers may employ the same shadow mask and occur simultaneously. Alternatively, deposition of the anode and cathode wiring layers may employ the same shadow mask but occur at different times, for example, by depositing the anode wiring layer and then moving the shadow mask to deposit the cathode wiring layer. In still another alternative, deposition of the anode and cathode wiring layers may employ different shadow masks and occur at different times.

Figure 3C:
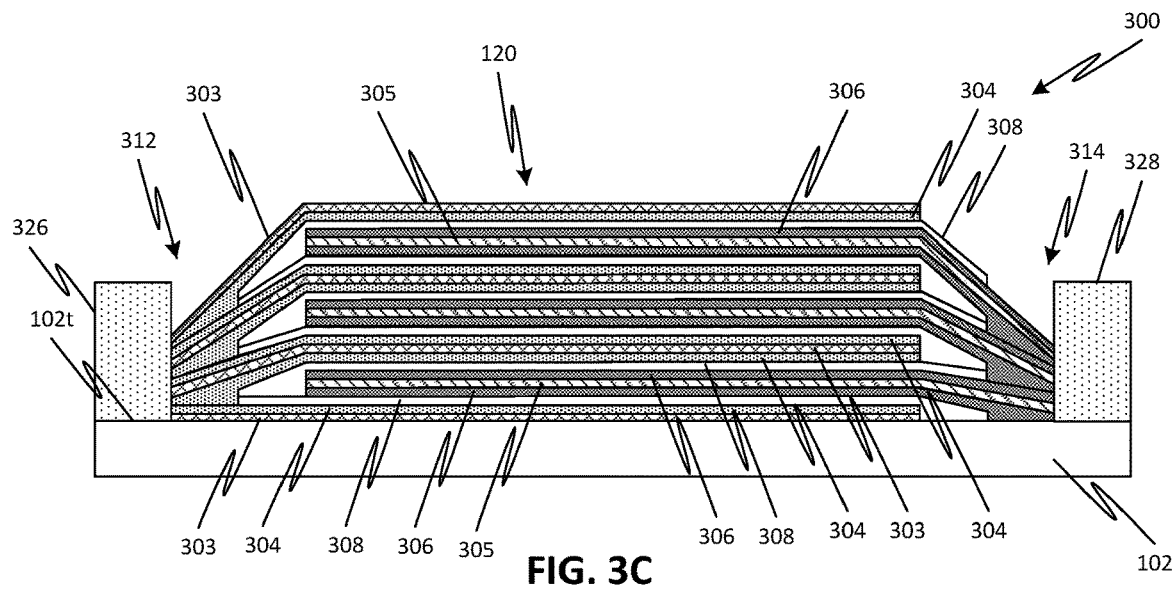
FIG. 3C is a cross-sectional view illustrating a second exemplary arrangement for wiring layers for the multi-layer solid-state battery of FIG. 3A.

In some embodiments, the wiring layers can be formed after additional processing at the respective contact regions 312, 314, for example, to improve electrical contact or to allow electrical connection to underlying structures by the same wiring layer formation. For example, the anodes 304 and anode current collectors 303 within anode contact region 312 can be processed to expose respective edges thereof, and anode wiring layer 326 can be deposited over and in electrical contact with the exposed edges, as illustrated in FIG. 3C. Similarly, the cathodes 306 and cathode current collectors 305 within cathode contact region 314 can be processed to expose respective edges thereof, and cathode wiring layer 328 can be deposited over and in electrical contact with the exposed edges. The processing to expose the edges of the layers in the anode contact region 312 and cathode contact region 314 can include, for example, patterning (e.g., photolithography), wet etching, reactive ion etching plasma etching, ion milling, laser machining, or grinding. The depositing of the anode wiring layer 326 and the cathode wiring layer 328 can include, for example, photolithography (e.g., a lift-off technique or depositing, patterning, and then etching a metal layer), metal spraying through a mask, 3-D printing, vacuum deposition, or any other conventional wiring method.

Although FIG. 3A illustrates connecting the multiple batteries of the stack in parallel, embodiments of the disclosed subject matter are not limited thereto. For example, some or all of the batteries of the stack on the non-planar substrate can be arranged so as to be connected in series, as illustrated by the multi-battery 350 of FIG. 3D. As with the battery configuration of FIG. 3A, each set of anodic electrode layer 304, solid electrolyte 308, and cathodic electrode layer 306 adjacent to each other in the stack define a single thin-film battery of the device 300. In contrast to FIG. 3A, the order of intermediate (i) layers is repeated in sequence, with anodic electrode layer 304$i$ and cathodic electrode layer 306$i$ of adjacent batteries in the stack sharing a common current collector 305$i$. The intermediate layers can have the same shape and be aligned with each other.

The uppermost and lowermost electrode layers in the stack can be offset from the intermediate layers for making electrical connections at respective edge contact regions. For example, anode current collector 303$b$ and anodic electrode layer 304$b$, which constitute the lowermost layer, are offset so as to be exposed from the intermediate layers of the stack, thereby allowing anode wiring layer 352 to directly connect thereto. Similarly, cathode current collector 305$u$ and cathodic electrode layer 306$u$, which constitute the uppermost layer, are offset from the intermediate layers of the stack, thereby allowing cathode wiring layer 354 to directly connect thereto along an edge region opposite to the anode wiring layer 352.

In some embodiments, it may be unnecessary to offset the uppermost electrode layer from the intermediate layers, in which case, the wiring layer connecting to the uppermost electrode layer (e.g., cathode current collector 305$u$ in FIG. 3D) may be formed overlapping with the intermediate layers. In addition, in some embodiments, it may be unnecessary to offset the lowermost electrode from the intermediate layers, for example, where the substrate 102 includes a terminal or land on a surface thereof for electrically connecting to the lowermost electrode layer (e.g., anode current collector 303$b$ in FIG. 3D). Thus, in a serial arrangement of the multi-battery, each of the layers may be aligned with each other rather than being offset.

As referenced above, the arrangement of multi-battery 350 can be combined with the arrangement of multi-battery 300, such that some of the batteries within a stack 120 on substrate 102 are connected in parallel while others are connected in series. For example, the lowermost current collector 303$b$ of multi-battery 350 may constitute the uppermost current collector 303 of multi-battery 300, with the intervening layers of FIG. 3D formed over the stack of FIG. 3A. Other combinations of serial and parallel battery layers are also possible according to one or more contemplated embodiments.

Although FIGS. 3A-3D illustrates a particular number of thin-film batteries wired together, embodiments are not limited thereto. Rather, additional or fewer battery layers are also possible according to one or more contemplated embodiments. Indeed, as noted above, additional layers can be added to the stack in a configuration similar to FIG. 3A or FIG. 3D in order to form additional batteries ad infinitum (or at least until a desired or practical number of batteries in the stack has been achieved).

As referenced above, the multi-battery can be wired to other devices or structures of the substrate via appropriate wiring layers. For example, as illustrated in FIG. 4A, the substrate 102 can include one or more electronic devices 404, such as a CMOS device, to be powered by battery 300, to control battery 300, or to otherwise interact with battery 300. The substrate 102 can have a passivation film 406 that protects the underlying electronic device 404 formed on surface 402 during fabrication of the battery 300 over the substrate 102. The passivation film 406 may thus form the structured or otherwise non-planar surface 102t of the substrate 102, on which the layers of battery 300 are formed. After formation of the battery 300, the anode contact region 312 and the cathode contact region 314 are connected to terminals of the underlying electronic device 404 by respective electrical wiring. For example, similar to the device of FIG. 3C, a via 419 can be formed through the layers of the battery 300 within the cathode contact region 314 and the passivation film 406, and then depositing wiring layer 420 to electrically connect the terminal 422 at the top the electronic device 404 with the cathode layers. An anode wiring layer connecting to the top of the electronic device 404 can be formed in a similar manner.

Alternatively or additionally, electrical connection from the battery to the electronic device can be made through a terminal and circuit trace under the passivation film. For example, as illustrated in FIG. 4A, a terminal 416 and circuit trace 410 can be formed on surface 402, with trace 410 connecting the surface terminal 416 to a terminal 412 of the electronic device 404. Similar to the device of FIG. 3C, a via 417 can then be formed through the layers of the battery 300 within the anode contact region 312 and the passivation film 406. Wiring layer 418 deposited in via 417 thus directly contacts surface terminal 416 to electrically connect the terminal 412 of the electronic device 404 with the anode layers. A cathode wiring layer connecting via a wiring layer 410 to the electronic device 404 can be formed in a similar manner.

Configurations for wiring between multi-battery 300 and electronic device 404 through passivation film 406 are not limited to those illustrated in FIG. 4A. Indeed, other configurations are also possible according to one or more contemplated embodiments. For example, a multi-layer interconnect (e.g., formed using a damascene process or the like) may be disposed between the passivation film 406 and the electronic device 404, and the wiring layers 418, 420 of battery 300 can connect to terminals of the multi-layer interconnect rather than the electronic device itself. In another example, when the battery does not overlap with the electronic device in plan view, the wirings 322, 324 of FIG. 3B can extend laterally and connect to a terminal (e.g., device terminal 422 or surface terminal 416 in FIG. 4A) by way of a respective via through the passivation film.

Although only a single multi-battery 300 and a single electronic device 404 are illustrated in FIG. 4A, embodiments of the disclosed subject matter are not limited thereto. Rather, a plurality of multi-batteries 300 may be integrated with one or more electronic devices and/or other multi-layer components on a common substrate 102. For example, the multi-batteries 300 on common substrate 432 can be wired together in parallel, as shown in the configuration 430b of FIG. 4B, or in series, as shown in the configuration 430c of FIG. 4C, or in any combination of the two. Such configurations can employ a common shadow mask with multiple open areas (i.e., one for each multi-battery 300 site), exploiting the offset between cathode, electrolyte, and anode related layers, as explained above.

For multi-batteries of relatively smaller planar size, a consideration in the device arrangement is the size/area required to make the anode and cathode contacts (e.g., wiring layers 322, 324 in FIG. 3B), so that the active area remains the dominant portion of the area used. For multi-batteries of larger sizes, additional considerations can include defect density and power management. In such cases, it may be advisable to create a plurality of multi-battery sites on the substrate, which multi-batteries may be electrically connected together for purposes such as power management, fault detection, adaptive cycling, system optimization, or safety (e.g., regulation by one or more control or power management chips 434, which may be connected to batteries 300 in a manner similar to FIG. 4A or as laid out in FIGS. 4B-4C). For example, the plurality of multi-batteries can be interconnected using printed circuit board technology, thin film wiring, shadow-mask deposition of wiring layers, or other packaging and systems approaches.

Other electronic devices can also be integrated with the multi-batteries on a common substrate. For example, as noted above, the selection of materials for the constituent layers of the stack over the substrate can determine operation of the multi-layer solid-state device. As such, another shadow mask can be used to form another multi-layer device on the substrate in a manner similar to the multi-batteries of FIG. 3A, and the device and batteries wired together to allow multifunctional operation. For example, the multi-layer solid-state device can be formed as a solar photovoltaic device, with the power generated by the device being stored in one or more multi-batteries on a common substrate, thereby forming a complete energy capture/storage system. In another example, the multi-layer solid-state device can be formed as an electrochemical or electrostatic capacitor, which when combined with the multi-batteries can provide a more efficient energy storage system. Other integrations are also possible according to one or more contemplated embodiments.

Figure 5A:
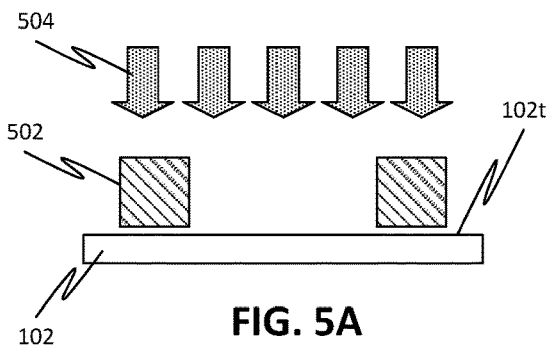
FIGS. 5A-5N illustrate various process steps employing a shadow mask to deposit layers on a nonplanar substrate in the fabrication of the multi-layer solid-state device of FIG. 1A.
Figure 5B:
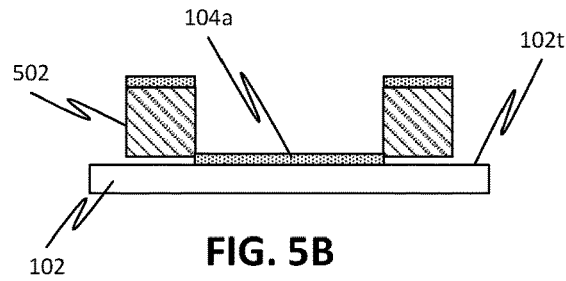
Figure 5C:
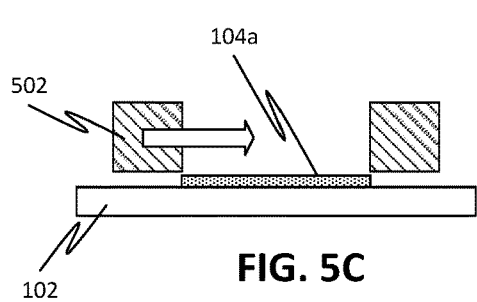
Figure 5D:
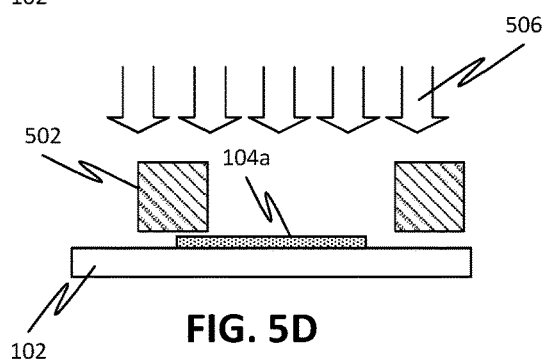
Figure 5E:
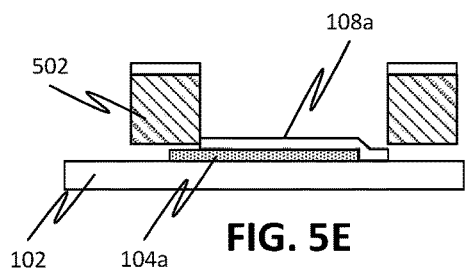
Figure 5F:
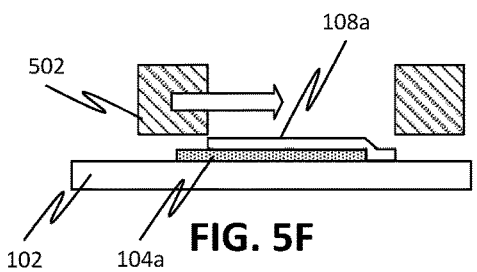
Figure 5G:
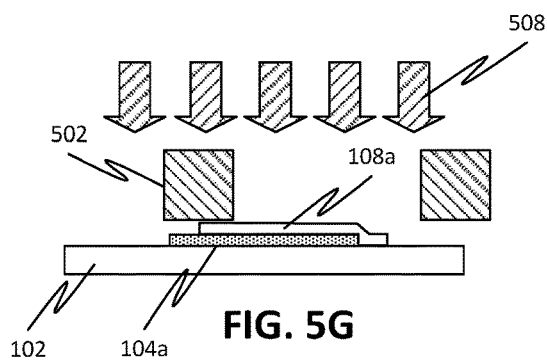
Figure 5H:
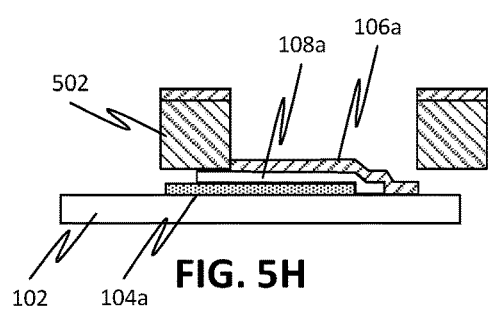
Figure 5I:
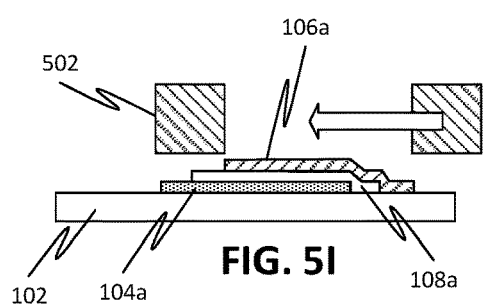
Figure 5J:
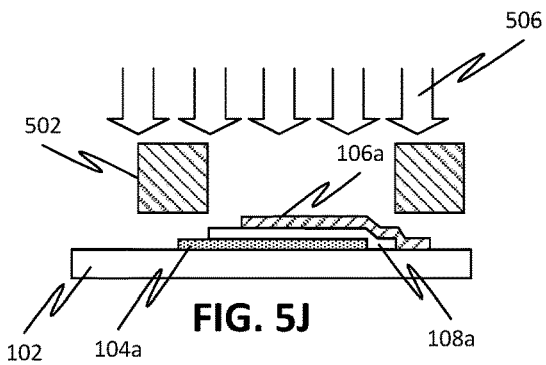
Figure 5K:
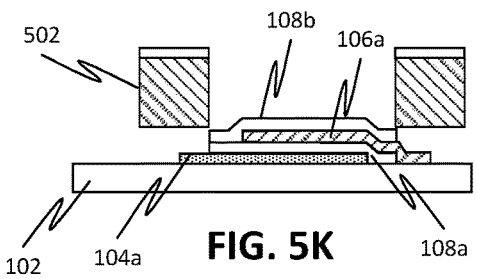
Figure 5L:
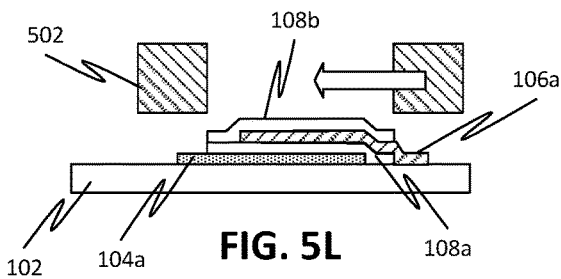
Figure 5M:
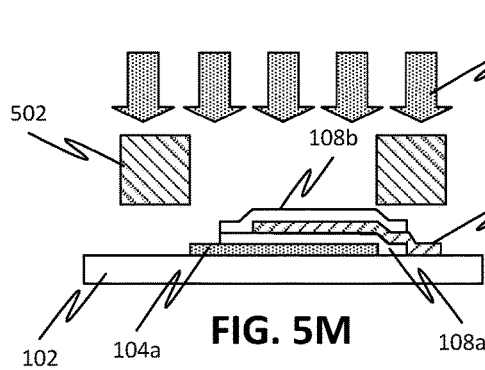
Figure 5N:
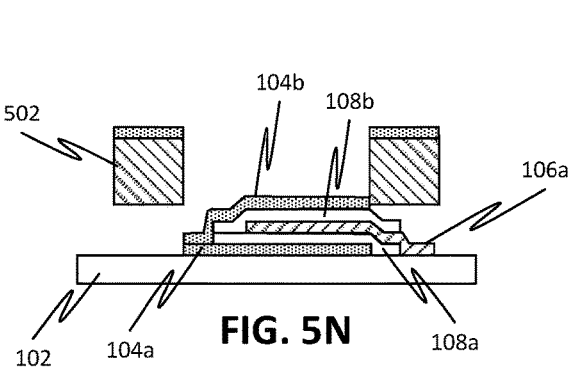
Figure 8A:
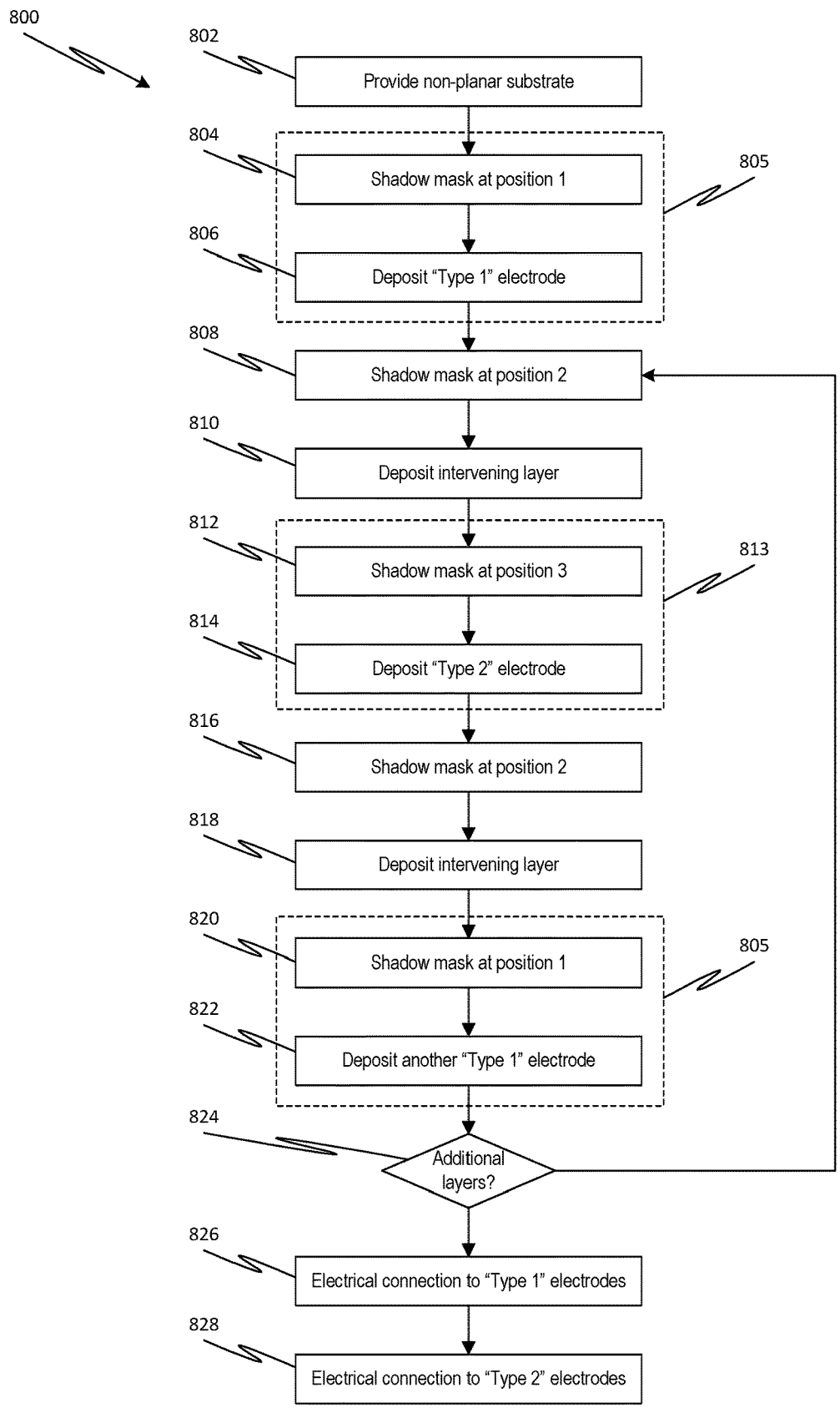
FIG. 8A illustrates a generalized process flow for forming a multi-layer solid-state device, according to one or more embodiments of the disclosed subject matter.

Referring to FIGS. 5A-5N and 8A, an exemplary fabrication process 800 for forming the multi-layer solid-state device 100 of FIG. 1A will be described. As noted above, the fabrication process can employ a common shadow mask 502, which has an aperture through which the deposition flux passes to define a shape of the deposited layer, to form each layer (or at least the majority of layers) of the stack of the multi-layer solid-state device. The use of a common shadow mask avoids the multiple steps of standard photolithographic patterning that would otherwise be required to define the separate layers. However, different shadow masks can also be used for different layers (e.g., if current collector layers and/or electrolyte layers have different patterns than the anode or cathode layers in a multi-battery stack) according to one or more embodiments.

The fabrication process 800 can begin at 802, where a non-planar substrate 102 is provided. For example, 802 can include forming the substrate 102 to have a non-planar surface 102t over which the various layers of multi-layer solid-state device will be formed. The forming the non-planar surface can include etching or machining to form one or more projection or recesses, as described above. Alternatively or additionally, specialized processes for creating non-planar surface structures can be employed, such as but not limited to, self-assembled nanopore synthesis by electrochemical anodization and use of colloidal templates. Alternatively or additionally, the forming can include manipulating (e.g., bending, casting, molding, or pressing) the substrate to have a desired shape for the non-planar surface, for example, by shaping a metal foil (e.g., forming a convoluted aluminum foil).

The fabrication process 800 can proceed to 804, where shadow mask 502 is moved to a first lateral position relative to the substrate 102 for forming a Type I electrode, as shown in FIG. 5A. The process 800 then proceeds to 806, where a material 504 for forming the first Type I electrode, e.g., first electrode 104a, is deposited on the upper surface 102t of the substrate, as shown in FIG. 5B. In embodiments where the device is configured as a battery, the Type I electrode can include one or more electrode sub-layers (e.g., anodic or cathodic electrode layers) and a corresponding current collector layer. In each deposition step, the material deposited atop the shadow mask 502 during the deposition may remain in place for subsequent deposition steps (not depicted in FIGS. 5C, 5F, 5I, and 5L) or can be removed before a subsequent deposition step.

Figure 8B:
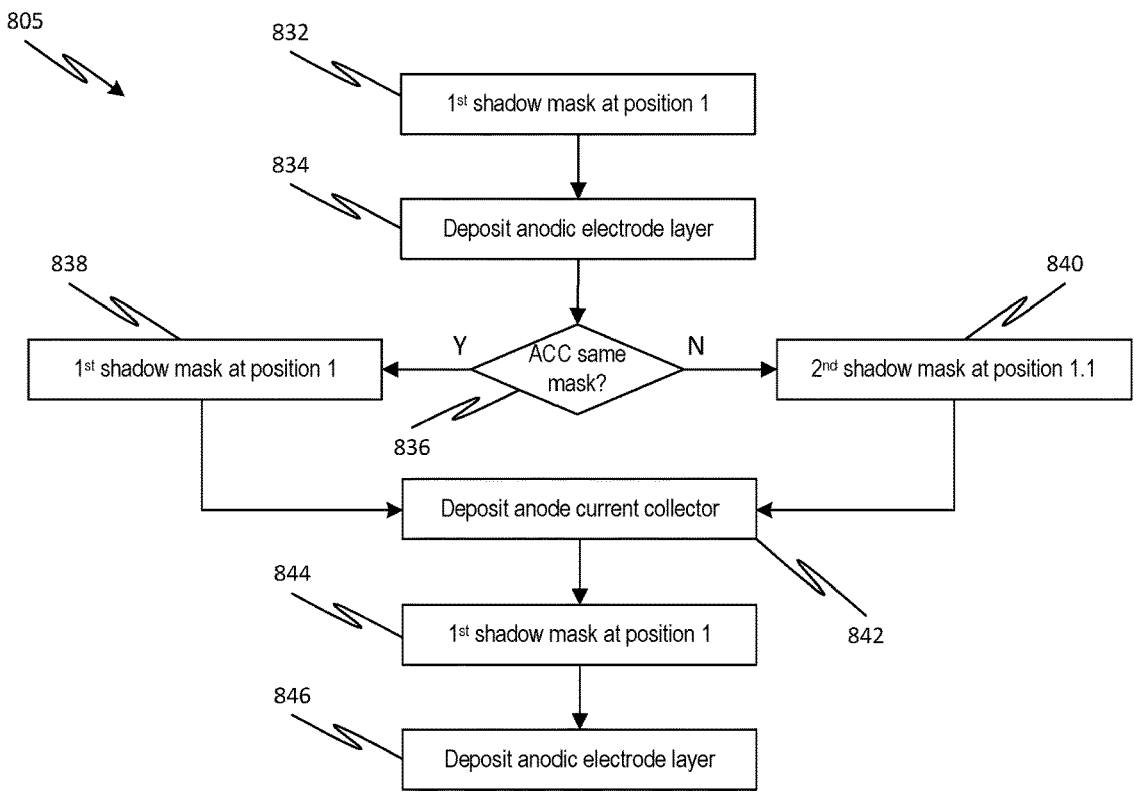
FIG. 8B illustrates a variation of process flow steps 805 of FIG. 8A for forming an anode of a multi-layer solid-state battery, according to one or more embodiments of the disclosed subject matter.

For example, when the Type I electrodes are anodes of a battery (e.g., battery 300 illustrated in FIG. 3A), the combination 805 of process steps 804 and 806 (or subsequent steps 820, 822) can be replaced by the process of FIG. 8B. At 832, the first shadow mask is moved to the first lateral position and then an anodic electrode layer is deposited at 834. At 836, it is determined if the same shadow mask is used for forming the anode current collector. If yes, the process proceeds to 838 where the first shadow mask is maintained at the first lateral position and the anode current collector is then deposited using the first shadow mask at 842. Otherwise, the process proceeds to 840, where a second shadow mask is substituted for the first shadow mask. The second shadow mask may be at a lateral position that coincides with the first lateral position or at a position offset from the first lateral position. The process then proceeds to 842, where the anode current collector is deposited using the second shadow mask. The process then proceeds to 844, where the first shadow mask is set again at the first lateral position for deposition of a second anodic electrode layer at 846.

Returning to FIG. 8A, the fabrication process 800 can then proceed to 808, where shadow mask 502 is moved from the first lateral position of FIG. 5C to a second lateral position relative to the substrate 102 for forming an intervening layer. As noted above, the second lateral position is offset from the first lateral position, as illustrated in FIG. 5D. The fabrication process 800 can then proceed to 810, where the deposition source is changed to a material 506 corresponding to the intervening layer. The material 506 is deposited over the substrate 102 and previously formed first electrode 104a to form an intervening layer, e.g., first intervening layer 108a, as illustrated in FIG. 5E.

The fabrication process 800 can then proceed to 812, where shadow mask 502 is moved from the second lateral position of FIG. 5E to a third lateral position relative to the substrate 102 for forming a Type II electrode. As noted above, the third lateral position is offset from the second lateral position, as illustrated in FIG. 5G. The fabrication process 800 can then proceed to 814, where the deposition source is again changed to a material 508 corresponding to the Type II electrode. The material 508 is deposited over the substrate 102 and previously formed first electrode 104a and intervening layer 108a to form the Type II electrode, e.g., second electrode 106a, as illustrated in FIG. 5H. The combination of first electrode 104a, intervening layer 108a, and second electrode 106a forms a first sub-device of the multi-device stack.

Figure 8C:
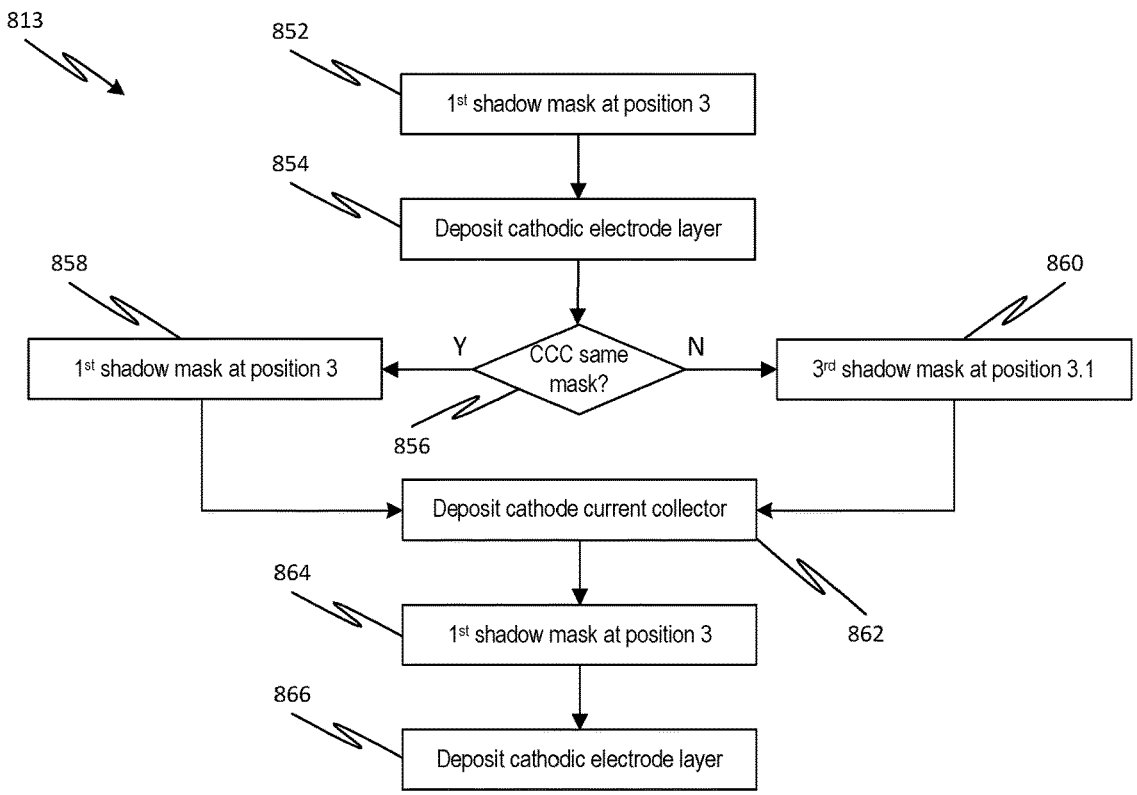
FIG. 8C illustrates a variation of process flow steps 813 of FIG. 8A for forming a cathode of a multi-layer solid-state battery, according to one or more embodiments of the disclosed subject matter.

For example, when the Type II electrodes are cathodes of a battery (e.g., battery 300 illustrated in FIG. 3A), the combination 813 of process steps 812 and 814 (and subsequent steps) can instead be replaced by the process of FIG. 8C. At 852, the first shadow mask is moved to the third lateral position and then a cathodic electrode layer is deposited at 854. At 856, it is determined if the same shadow mask is used for forming the cathode current collector. If yes, the process proceeds to 858 where the first shadow mask is maintained at the third lateral position and the cathode current collector is then deposited using the first shadow mask at 862. Otherwise, the process proceeds to 860, where a third shadow mask is substituted for the first shadow mask. The third shadow mask may be at a lateral position that coincides with the third lateral position or at a position offset from the third lateral position. The process then proceeds to 862, where the cathode current collector is deposited using the third shadow mask. The process then proceeds to 864, where the first shadow mask is set again at the third lateral position for deposition of a second cathodic electrode layer at 866.

When the Type I electrodes are cathodes and the Type II electrodes are anodes, FIG. 8C may instead apply to combination 805 and FIG. 8B may apply to combination 813, with appropriate variations for positioning the shadow masks. Each electrode of the battery thus includes a pair of anodic electrode layers with a common current collector layer therebetween. However, when the electrode is formed as an uppermost layer or lowermost layer of the stack, one of the electrode layers may be omitted. Thus, the respective current collector can be exposed at the uppermost layer, and the respective current collector of the lowermost layer may be the first layer over the substrate.

The fabrication process 800 can proceed to 816, where shadow mask 502 is moved from the third lateral position of FIG. 5I back to the second lateral position relative to the substrate 102 for forming another intervening layer, as illustrated in FIG. 5J. The fabrication process 800 can then proceed to 818, where the deposition source is changed to material 506 corresponding to the intervening layer. The material 506 is deposited over the substrate 102 and previously formed layers to form another intervening layer, e.g., second intervening layer 108b, as illustrated in FIG. 5K. The fabrication process 800 can then proceed to 820, where shadow mask 502 is moved from the second lateral position of FIG. 5L back to the first lateral position relative to the substrate 102 for forming another Type I electrode, as illustrated in FIG. 5M. The fabrication process 800 can then proceed to 822, where the deposition source is changed to material 504 corresponding to the Type I electrode. The material 504 is deposited over the substrate 102 and previously formed layers to form another Type I electrode, e.g., third electrode 104b, as illustrated in FIG. 5N. The combination of second electrode 106a, intervening layer 108b, and third electrode 104b forms a second sub-device of the multi-device stack.

The fabrication process 800 can proceed to 824, where it is determined if additional sub-devices, and thus additional electrode and intervening layers, are desired. If additional layers are desired, the process 800 can repeat steps 808-822 to form the additional devices, for example, third electrode 106b, fourth electrode 104c, and intervening layers 108c-108d of FIG. 1A. Otherwise, the process 800 can proceed to 826, where a wiring layer is formed to electrically connect to the Type I electrodes (e.g., in first edge region 112), and then to 828, where a wiring layer is formed to electrically connect to the Type II electrodes (e.g., in second edge region 114). As noted above, the wiring layer can be formed over the uppermost electrode layer in the corresponding edge region (e.g., by depositing a wiring layer over the edge region), or in contact with at least some edges of the electrode layers in the corresponding edge region (e.g., by removing material from the edge region and then depositing the wiring layer in contact with exposed edges of the electrode layers).

During deposition, the shadow mask 502 is disposed in close proximity to or touching the substrate 102. However, when being moved between positions, the shadow mask 502 and the substrate 102 may be spaced from each other to avoid damaging already deposited layers. The above description focuses on moving the shadow mask 502. However, in an alternative, it is also possible for the shadow mask 502 to be held stationary and the substrate 102 instead to be moved to provide the relative displacement between first through third positions. In still another alternative, both the shadow mask 502 and the substrate 102 may move to effect displacement between the first through third positions.

Although steps 802-828 of process 800 have been illustrated separate from each other and in a specific order, embodiments of the disclosed subject matter are not limited to that particular arrangement. Indeed, in practical embodiments, certain steps may be combined or rearranged. For example, the electrical connection of 828 may occur before or contemporaneously with the electrical connection of 826. Alternatively or additionally, the first deposited electrode may be a Type II electrode rather than a Type I electrode. Moreover, additional non-illustrated process steps may be included between or after the illustrated process steps. For example, in between or after parallel configured layers, layers may be deposited without moving the shadow mask so as to form a serial configuration (e.g., as in FIG. 3D).

In some embodiments, the process steps of FIG. 8A may build multiple devices, as similarly configured devices (e.g., the array of batteries illustrated in FIGS. 4B-4C) or differently configured devices (e.g., a battery combined with a capacitor), at a same time on a common substrate by using one or more common shadow masks. For example, a multi-layer battery can be formed with a multi-layer capacitor on a common substrate, where the material for the current collector layers of the battery is the same as that of the electrodes of the capacitor. A first shadow mask can be used to form the solid electrolyte layers, anodic electrode layers, and cathodic electrode layers of the battery, with appropriate offset of the mask pattern to form the different layers. A second shadow mask can be used to form the current collector layer and the capacitor electrodes at the same time, while a third shadow mask can be used to form the dielectric layers of the capacitor.

The first shadow mask can include apertures in battery formation regions only, such that no material is deposited in the capacitor formation regions during deposition using the first shadow mask. Similarly, the third shadow mask can include apertures in capacitor formation regions only, such that no material is deposited in the battery formation regions during deposition using the third shadow mask. Alternatively, the first and third shadow masks can be combined together, and a mechanism (e.g., moving shutter or moving fourth mask) can be provided for blocking off apertures in the capacitor formation region during deposition of materials for the battery, and vice-versa.

In some embodiments, even though the current collector layer and the capacitor electrode employ the second shadow mask, the aperture patterns therein may be the same (or substantially the same) as the respective patterns of the first and third shadow masks. In other words, the aperture pattern of the first shadow mask that defines the electrode and electrolyte layers of the battery may be the same in plan view as the aperture pattern of the second shadow mask that defines the current collector layer. Similarly, the aperture pattern of the third shadow mask that defines the dielectric of the capacitor may be the same in plan view as the aperture pattern of the second shadow mask that defines the capacitor electrodes. Thus, the above description with respect to offsetting of the common shadow mask can also apply to the offset of similarly-shaped aperture patterns to form the different constituent layers of a multi-layer solid-state device, even if those aperture patterns are on different shadow masks.

In some embodiments, the process steps of FIG. 8A may build multiple similarly configured devices with different structures (e.g., batteries having different layer thicknesses), at a same time or sequentially. For example, a first multi-layer battery can be formed having thinner electrodes in order to provide higher power, while a second multi-layer battery on the same substrate may have thicker electrodes for higher stored energy. The first multi-layer battery can be formed by a first iteration of process 800 of FIG. 8A using a first shadow mask, where the formation region of the second battery is otherwise blocked by the first shadow mask. The second multi-layer battery can be formed by a second iteration of process 800 using the first shadow mask in a new position, where the formation region of the first battery is now blocked by the first shadow mask. The differences in thicknesses between the first and second batteries can be controlled by material deposition rate and/or time during the respective iteration of process 800.

Alternatively or additionally, the first and second multi-layer batteries can be built at a same using a common shadow mask, where a mechanism (e.g., moving shutter or moving mask) blocks apertures for the first battery once a desired thickness is reached but allows deposition to continue for the second battery. In another example, the first and second multi-layer batteries can have similar layer thicknesses but a different pattern in plan view (e.g., the first having the pattern of FIG. 1C and the second having the pattern of FIG. 1E). Thus, in some embodiments, a common shadow mask with different aperture patterns can be used to simultaneous form the first and second multi-layer batteries.

Other combinations of devices and/or process variations beyond those specifically discussed above are also possible by appropriate control of deposition materials and mask patterns. Indeed, although the examples above discuss batteries and/or capacitors, the teachings of those examples are equally applicable to the other multi-layer solid-state devices, such as but not limited to, sensors, electro-optic devices, and energy storage devices. Moreover, although the examples above focus on combining two devices, the teachings of those examples are equally applicable to combining more than two devices, such as, but not limited to, forming batteries, capacitors, and solar cells on a common substrate.

Figure 6A:
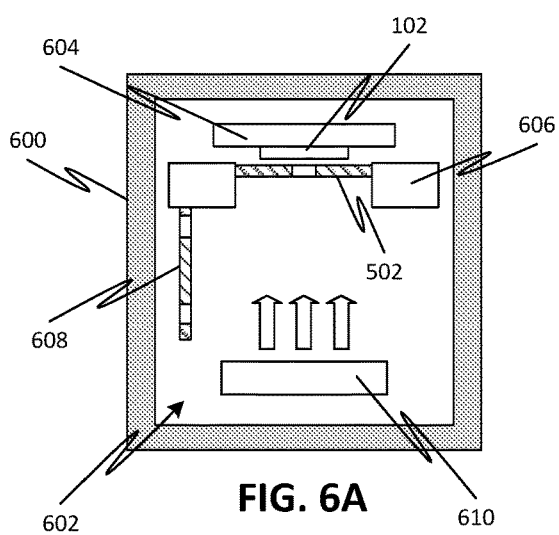
FIG. 6A illustrates an exemplary vacuum chamber setup for shadow mask deposition of layers of a multi-layer solid-state device, according to one or more embodiments of the disclosed subject matter.

In some embodiments, at least process steps 804-824 occur while maintaining vacuum conditions (e.g., under a continuous vacuum). For example, the substrate 102 may be arranged in an evacuated volume 602 of a vacuum-based deposition chamber 600, as illustrated in FIG. 6A. The deposition chamber 600 can provide sources 610 for depositing multiple materials in a single process, so that one material can be deposited after another as per FIGS. 5A-5N. For example, sputter deposition equipment within a single vacuum system can accommodate multiple magnetron sputter sources, each covering a different material. Alternatively, cluster tools can quickly move substrates between different sputter chambers, each dedicated to a specific material. In another example, gas phase CVD or ALD deposition can change from one material to another by a change of reactant gases.

The substrate 102 can be held by a support 604, which may be capable of displacing in two-dimensions (preferably in three-dimensions) and/or of heating the substrate 102 during or after deposition. Depositions of individual materials occur with shadow mask 502 in place in front of the substrate 102, either in close proximity or touching the substrate. The shadow mask 502 can be supported by a stage 606 that can move laterally in two dimensions with respect to the substrate 102. Preferably, the stage 606 can also move in a third direction to adjust spacing between the shadow mask 502 and the substrate 102. In some embodiments, only one of the support 604 and the mask stage 606 is capable of motion. In other embodiments, both of the support 604 and the mask stage 606 are capable of motion in at least one dimension. The relative movement between the substrate 102 and the shadow mask 502 allows for the deposition of different materials in different places on the substrate 102, where such materials correspond to Type I electrodes, intervening layers, or Type II electrodes.

In some embodiments, the formation of the wiring layers in process steps 826-828 may also occur in the same deposition chamber 600 while maintaining vacuum conditions by using a second shadow mask. In some embodiments, the second shadow mask may be used to form a constituent layer of the Type I or Type II electrodes, for example, when the current collector has a different pattern than the associated anodic or cathodic electrode layers, or when a layer for a separate device is to be deposited on the substrate at a same time as the current collector. In such embodiments, the mask stage 606 may be configured to switch from the first shadow mask 502 to a second shadow mask 608. Alternatively or additionally, the mask stage 606 may have an array of different shadow masks and can select a particular shadow mask for a particular layer, for example, a first wiring shadow mask to electrically connect to the Type I electrodes and a second wiring shadow mask to electrically connect to the Type II electrodes. Alternatively or additionally, the vacuum chamber 600 can include an airlock that allows for introduction of a new shadow mask to the mask stage 606 while maintaining vacuum conditions.

Figure 6B:
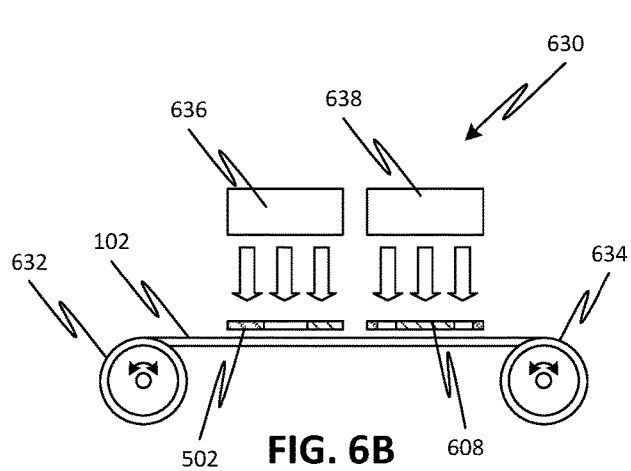
FIG. 6B illustrates an exemplary roll-to-roll processing setup for shadow mask deposition of layers of a multi-layer solid-state device, according to one or more embodiments of the disclosed subject matter.

In another example illustrated in FIG. 6B, fabrication can employ a roll-to-roll configuration 630, where a continuous flexible substrate 102 extending between an input roll 632 and an output roll 624 is supported within a vacuum deposition chamber (not shown). A first shadow mask 502 can be disposed in close proximity to or touching the substrate 102 in a first deposition stage, where a multi-material source 636 sequentially deposits materials forming the various layers of the multi-layer solid-state device. Between individual layer deposition, rolls 632, 634 can move the substrate 102 while keeping the shadow mask 502 stationary, thereby providing the desired lateral offset between subsequent layers. Once all constituent layers of the stack have been formed, the rolls 632, 634 can move the substrate 102 to a second stage, wherein a deposition source 638 deposits wiring layers through a second shadow mask 608.

In some embodiments, the deposition of one or more of process steps 804-822 is a physical vapor deposition or physical liquid deposition technique. For example, when the features of the non-planar surface have an aspect ratio of at least 0.5:1 (e.g., less than 5:1, or less than 3:1), physical deposition techniques can be employed. Physical vapor deposition techniques can include at least one of sputtering, evaporation, pulsed laser deposition, and molecular-beam epitaxy. Physical liquid deposition techniques include at least one of sol-gel coating, polymer solution coating, aerosol deposition, and inkjet printing.

Figure 7A:
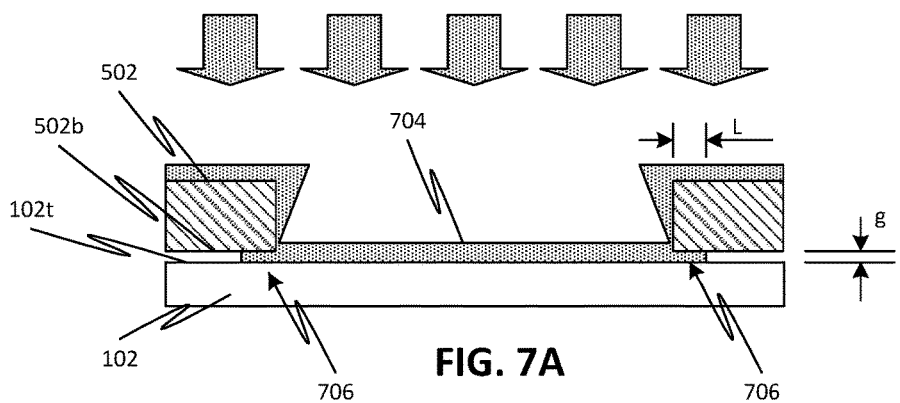
FIG. 7A is a simplified cross-sectional view illustrating a shadow mask configuration for physical deposition of a layer, according to one or more embodiments of the disclosed subject matter.

As referenced above, physical deposition of layer 704 occurs with shadow mask 502 in place in front of the substrate 102, with a bottom surface 502*b* of the mask either in close proximity to or touching the upper surface 102*t* of substrate 102, as illustrated in FIG. 7A. If a non-zero gap, g, is present between the bottom surface 502*b*, some amount of deposition will occur under the shadow mask. Encroachment 706 of deposited material under the shadow mask 502 occurs due to deposited atoms arriving at non-normal angles to the surface, or due to scattering in the gas phase. The amount, L, of encroachment 706 may be considered in determining an appropriate amount of offset between layers (e.g., offset in direction 122 of FIGS. 1B-1E), such that a minimum distance in plan view between Type I electrodes 104, intervening layers 108, and Type II electrodes 106 is maintained.

In some embodiments, the deposition of one or more of process steps 804-822 is a chemical deposition technique. For example, when the features of the non-planar surface have an aspect ratio greater than 3:1, chemical deposition techniques can be employed as they provide a greater of conformal coating than physical deposition techniques. Chemical deposition techniques can include at least one of electrochemical (e.g., electroplating) or chemical solution deposition, chemical vapor deposition (CVD), atomic layer deposition (ALD), and molecular layer deposition, as well as plasma enhanced versions thereof. Electrodeposition can use an electric field to form a layer of metals, oxides, or conductive polymers, while chemical solution deposition can use a chemical reaction without an electric field to form layers. For example, the chemical solution deposition can involve a chemical reduction or oxidation of metals or polymerization.

In some embodiments, different techniques can be applied to different layers, for example, by using chemical deposition for solid electrolyte layers and physical deposition for current collector layers. In some embodiments, the various deposition techniques can be combined to form one or more layers. For example, a metal layer may be deposited by electrodeposition followed by thermal oxidation to yield a metal oxide. In another example, a metal layer may be deposited by electrodeposition followed by treatment with $H_2S$ gas to yield a metal sulfide. In still another example, a metal layer may be deposited by electrodeposition on a current collector previously formed by physical or chemical deposition in order to improve electrical contact characteristics. Other variations and combinations of deposition techniques are also possible according to one or more contemplated embodiments.

Figure 7B:
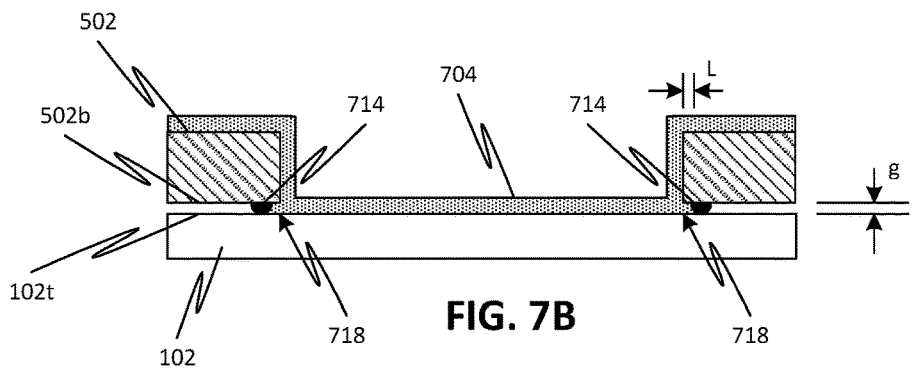
FIG. 7B is a simplified cross-sectional view illustrating a shadow mask configuration with sealing member for chemical deposition of a layer, according to one or more embodiments of the disclosed subject matter.

As referenced above, chemical deposition of layer 704 also occurs with shadow mask 502 in place in front of substrate 102, with a bottom surface 502*b* of the mask either in close proximity to or touching the upper surface 102*t* of substrate 102, as illustrated in FIG. 7B. However, due to the relatively high conformality of the chemical deposition techniques, any encroachment under the shadow mask 502 due to a non-zero gap, g, would be substantially higher than physical deposition techniques. Thus, when using chemical deposition, it is preferred that a least a portion of the shadow mask 502 adjacent to the aperture through which deposition occurs be in contact with the upper surface 102*t* of the substrate 102. For example, the shadow mask 502 can include a sealing member 714 (e.g., an O-ring or other seal) that surrounds the aperture and contacts the upper surface 102*t* of the substrate 102 to limit the lateral extent of any encroachment 718.

Figure 7C:
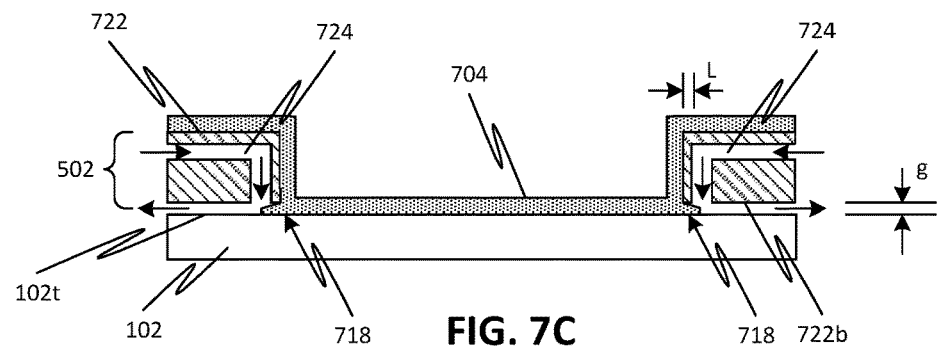
FIG. 7C is a simplified cross-sectional view illustrating a shadow mask configuration with inert gas flow for chemical deposition of a layer, according to one or more embodiments of the disclosed subject matter.

Alternatively or additionally, an inert gas flow can be provided to the shadow mask to sweep away any encroachment under the shadow mask during chemical deposition. For example, FIG. 7C illustrates a modified shadow mask 722 that has a bottom surface 722b spaced from the upper surface 102t of the substrate 102 by a non-zero gap, g. An air flow path 724 is provided within the shadow mask 722, with an outlet that directs inert gas flowing along path 724 between the bottom surface 722b and the upper surface 102t. The inert gas flow can thus exhaust any gases that would otherwise deposit material 718 and thus encroach under the shadow mask 722. Alternatively, a holder of the shadow mask may be provided with appropriate air flow paths for directing an inert gas flow along bottom surface of the shadow mask.

Figure 7D:
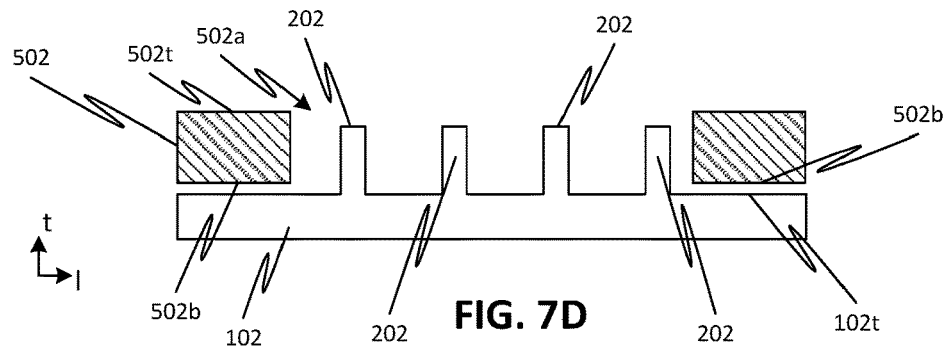
FIG. 7D is a simplified cross-sectional view illustrating a first arrangement of a shadow mask with respect to a deposition surface of a non-planar substrate, according to one or more embodiments of the disclosed subject matter.
Figure 7E:
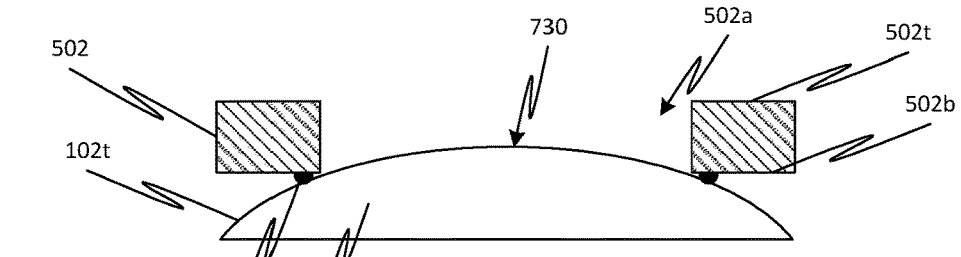
FIG. 7E is a simplified cross-sectional view illustrating a second arrangement of a shadow mask with respect to a deposition surface of a non-planar substrate, according to one or more embodiments of the disclosed subject matter.

In some embodiments, the shadow mask can be disposed sufficiently close to the substrate during deposition such that at least a portion of the substrate is within an aperture of the shadow mask, i.e., a portion of the substrate is at a level between a bottom surface of the shadow mask and a top surface of the shadow mask in cross-sectional view. For example, when the substrate 102 includes protrusions 202 as illustrated in FIG. 7D, at least one of those protrusions 202 can extend into an aperture 502a of the shadow mask 502, so as to be between the top surface 502t and the bottom surface 502b of the mask 502 along the thickness direction, t. In another example, when the substrate 102 has a curved surface 102t as illustrated in FIG. 7E, at least a portion 730 can extend into an aperture 502a of the shadow mask 502, so as to be between the top surface 502t and the bottom surface 502b of the mask 502 along the thickness direction, t.

Figure 7F:
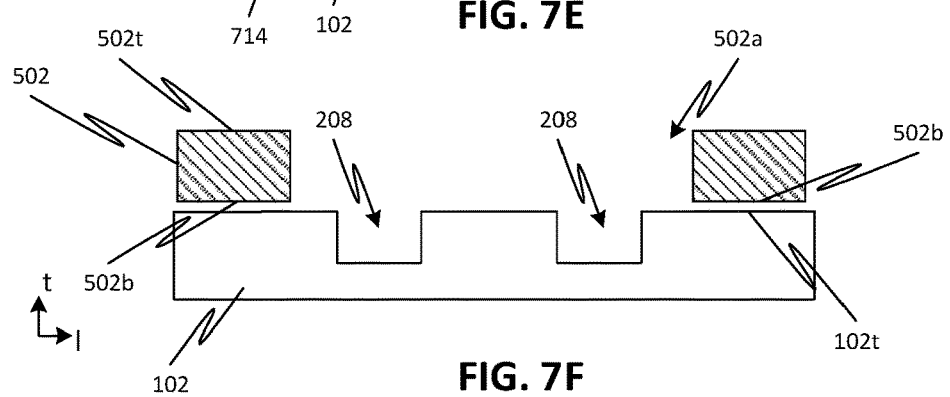
FIG. 7F is a simplified cross-sectional view illustrating a third arrangement of a shadow mask with respect to a deposition surface of a non-planar substrate, according to one or more embodiments of the disclosed subject matter.

In other embodiments, the shadow mask is disposed sufficiently close to an uppermost surface of the substrate during deposition, but without any portion of the substrate being within the aperture of the shadow mask. For example, the shadow mask may be flexible so as to conform to the curved surface 102t of the substrate. In such a configuration, the curved portion may be considered to lie below the curved bottom surface of the shadow mask and thus outside the shadow mask aperture. In another example, when the substrate 102 includes recesses 208 as illustrated in FIG. 7F, the bottom surface 502b of the shadow mask 502 may be adjacent to an uppermost portion of the non-planar surface 102t, such that no portion of substrate 102 extends into aperture 502a (i.e., each portion of substrate 102 is below bottom surface 502b of the shadow mask).

Numerous variations in the fabrication processes described above are also possible according to one or more contemplated embodiments. For example, different deposition process types can be employed in the sequence of layers, e.g., using sputter deposition of the electrodes (or constituent layers thereof) while using CVD or ALD for the intervening layer (e.g., electrolyte). Alternatively or additionally, the shadow mask can be removed or omitted when depositing the intervening layer (e.g., electrolyte). When employing high conformality processes like CVD and ALD for the deposition, the intervening layer can be deposited over the entire substrate surface. In such a configuration, the wiring approach of FIG. 3C can be used to make appropriate contact to the edges of electrodes (e.g., the anode/cathode sublayers and/or respective current collectors).

Although particular components and wiring configuration have been illustrated in the figures and discussed in detail herein, embodiments of the disclosed subject matter are not limited thereto. Indeed, one of ordinary skill in the art will readily appreciate that different components or wiring configurations can be selected and/or components added to provide the same effect. In practical implementations, embodiments may include additional components or other variations beyond those illustrated, for example, additional wiring layers to connect different components on the same substrate. Accordingly, embodiments of the disclosed subject matter are not limited to the particular configurations specifically illustrated and described herein.

In one or more first embodiments, a method of forming a multi-layer solid-state device, the method comprises depositing at least a portion of a first electrode over a first surface of a substrate using a first shadow mask in a first position with respect to the substrate. In the method, after the depositing, at least one of the substrate and the first shadow mask is displaced with respect to the other of the substrate and the first shadow mask, such that the first shadow mask is in a second position with respect to the substrate. The method also comprises depositing a first intervening layer over the first electrode using the first shadow mask in the second position, where the first position is offset from the second position in at least one dimension in plan view.

In the method, after the depositing, at least one of the substrate and the first shadow mask is displaced with respect to the other of the substrate and the first shadow mask, such that the first shadow mask is in a third position with respect to the substrate. The method also comprises depositing at least a portion of a second electrode over the first intervening layer using the first shadow mask in the third position, where the second position is offset from the third position in at least one dimension in plan view.

In the method, after the depositing, at least one of the substrate and the first shadow mask is displaced with respect to the other of the substrate and the first shadow mask, such that the first shadow mask is in a fourth position with respect to the substrate. The method also comprises depositing a second intervening layer over the second electrode using the first shadow mask in the fourth position, where the fourth position is aligned with the second position in plan view.

In the method, after the depositing, at least one of the substrate and the first shadow mask is displaced with respect to the other of the substrate and the first shadow mask, such that the first shadow mask is in a fifth position with respect to the substrate. The method also comprises depositing at least a portion of a third electrode over the second intervening layer using the first shadow mask in the fifth position, where the fifth position is aligned with the first position in plan view.

In the first embodiments or any other embodiment, at least a portion of the first surface is non-planar. The deposited layers forming the first through third electrodes and the first and second intervening layers can conform to or follow the non-planar first surface so as to have a three-dimensional non-planar geometry. Available deposition surface area of the non-planar first surface can be greater than an area of the deposition area of the first shadow mask in plan view.

In the first embodiments or any other embodiment, parts of the first and third electrodes are in direct contact with each other in a first edge region, and each intervening layer is spaced from the first edge region in plan view.

In the first embodiments or any other embodiment, the method further comprises displacing at least one of the substrate and the first shadow mask with respect to the other of the substrate and the first shadow mask, such that the first shadow mask is in a sixth position with respect to the substrate, and depositing a third intervening layer over the third electrode using the first shadow mask in the sixth position, the sixth position being aligned with the second position in plan view. In the method, after the depositing, at least one of the substrate and the first shadow mask is displaced with respect to the other of the substrate and the first shadow mask, such that the first shadow mask is in a seventh position with respect to the substrate. The method also includes depositing at least a portion of a fourth electrode over the third intervening layer using the first shadow mask in the seventh position, where the seventh position is aligned with the third position in plan view.

In the first embodiments or any other embodiment, parts of the second and fourth electrodes are in direct contact with each other in a second edge region, the first edge region does not overlap with the second edge region in plan view, and each intervening layer is between the first edge region and the second edge region in plan view.

In the first embodiments or any other embodiment, the method further comprises forming a first wiring layer on an uppermost electrode in the first edge region so as to electrically connect to the first and third electrodes, and forming a second wiring layer on an uppermost electrode in the second edge region so as to electrically connect to the second and fourth electrodes. In the first embodiments or any other embodiment, at least one of the first and second wiring layers is formed by depositing using a second shadow mask different from the first shadow mask. In the first embodiments or any other embodiment, at least one of the first and second wiring layers is formed by one or more of photolithography, vacuum deposition, metal spraying through a mask, and 3D printing.

In the first embodiments or any other embodiment, the method further comprises removing material in the first and second edge regions, respectively, forming a first wiring layer in the first edge region so as to electrically connect to the first and third electrodes, and forming a second wiring layer in the second edge region so as to electrically connect to the second and fourth electrodes. In the first embodiments or any other embodiment, the removing material comprises one or more of reactive ion etching, plasma etching, ion milling, wet etching, laser etching, and grinding.

In the first embodiments or any other embodiment, the multi-layer solid-state device comprises a battery, each of the first and third electrodes comprises one of an anode and a cathode, the second electrode comprises the other of an anode and a cathode, and each intervening layer comprises a solid electrolyte. In the first embodiments or any other embodiment, each of the first through third electrodes comprises a respective current collector layer for electron transport.

In the first embodiments or any other embodiment, the first electrode includes at least a first current collector layer and a first electrode layer, and the depositing the first electrode includes depositing the first current collector layer over the first surface of the substrate, and depositing the first electrode layer over the first current collector layer.

In the first embodiments or any other embodiment, the second electrode includes at least second and third electrode layers and a second current collector layer, and the depositing the second electrode includes depositing the second electrode layer over the first intervening layer, depositing the second current collector layer over the second electrode layer, and depositing the third electrode layer over the second current collector layer.

In the first embodiments or any other embodiment, the third electrode includes at least a fourth electrode layer and a third current collector layer, and the depositing the third electrode includes depositing the fourth electrode layer over the second intervening layer, and depositing the third current collector layer over the fourth electrode layer.

In the first embodiments or any other embodiment, the depositing of the first electrode layer and the first current collector layer can use the first shadow mask in the first position. In the first embodiments or any other embodiment, the depositing of the second electrode layer, the second current collector layer, and the third electrode layer can use the first shadow mask in the third position. In the first embodiments or any other embodiment, the depositing of the fourth electrode layer and the third current collector layer can use the first shadow mask in the fifth position.

In the first embodiments or any other embodiment, the third electrode includes at least fourth and fifth electrode layers and a third current collector layer, and the depositing the third electrode includes depositing the fourth electrode layer over the second intervening layer, and depositing the third current collector layer over the fourth electrode layer, and depositing the fifth electrode layer over the third current collector layer.

In the first embodiments or any other embodiment, the depositing of the fourth electrode layer, the third current collector layer, and the fifth electrode layer use the first shadow mask in the fifth position.

In the first embodiments or any other embodiment, the depositing of first current collector layer uses a second shadow mask, the depositing of the first electrode layer uses the first shadow mask in the first position, and the first shadow mask has a different pattern than the second shadow mask.

In the first embodiments or any other embodiment, the depositing of the second current collector layer uses a third shadow mask, the depositing of the second electrode layer and the third electrode layer use the first shadow mask in the third position, and the first shadow mask has a different pattern than the third shadow mask.

In the first embodiments or any other embodiment, the depositing of the third current collector layer uses a fourth shadow mask, the depositing of the fourth electrode layer uses the first shadow mask in the fifth position, and the first shadow mask has a different pattern than the fourth shadow mask.

In the first embodiments or any other embodiment, an overlapping area between the first through third electrodes in plan or cross-sectional view defines an active area of the multi-layer battery.

In the first embodiments or any other embodiment, each of the first through third electrodes comprises an upper electrode layer, a current collector layer for electron transport, and a lower electrode layer, and the current collector layer is disposed between the upper and lower electrode layers in cross-sectional view.

In the first embodiments or any other embodiment, the second position is offset from the first position in at least two orthogonal dimensions in plan view, and/or the third position is offset from the second position in at least two orthogonal dimensions in plan view.

In the first embodiments or any other embodiment, said portion of the first surface has a non-zero curvature in cross-sectional view.

In the first embodiments or any other embodiment, the first shadow mask is flexible, and a shape of the first shadow mask in cross-sectional view during the depositing of at least one of the first through third electrodes and first through second intervening layers follows the curvature of the portion of the first surface.

In the first embodiments or any other embodiment, the first shadow mask has a top surface, a bottom surface, and an aperture extending between the top and bottom surfaces, respective materials are deposited over the substrate through said aperture, and at least a portion of the substrate within said aperture is between the top and bottom surfaces of the first shadow mask in cross-sectional view during the depositing of at least the first electrode.

In the first embodiments or any other embodiment, the substrate includes at least one projection or recess that has side, bottom, or top surface portions defining said first surface, and each of the electrodes and intervening layers is formed over the at least one projection or recess.

In the first embodiments or any other embodiment, the projection or recess has an aspect ratio of height to width of at least 0.5:1, and the depositing of at least one of first through third electrodes and first through second intervening layers comprises a physical vapor deposition or physical liquid deposition technique. In the first embodiments or any other embodiment, the physical vapor deposition technique comprises at least one of sputtering, evaporation, pulsed laser deposition, and molecular-beam epitaxy, and the physical liquid deposition technique comprises at least one of sol-gel deposition, aerosol deposition, and inkjet printing.

In the first embodiments or any other embodiment, the projection or recess has an aspect ratio of height to width of at least 0.5:1, and the depositing of at least one of first through third electrodes and first through third intervening layers comprises a chemical deposition technique. In the first embodiments or any other embodiment, the chemical deposition technique comprises at least one of chemical vapor deposition (CVD), atomic layer deposition (ALD), and molecular layer deposition.

In the first embodiments or any other embodiment, the first surface includes portions at different levels in cross-sectional view, and a thickness of at least one of the electrodes and intervening layers deposited over one portion of the first surface is different from a thickness of said at least one of the electrodes and intervening layers deposited over another portion of the first surface.

In the first embodiments or any other embodiment, during the depositing of at least one of first through third electrodes and first through second intervening layers, a first portion of the first surface is closer to the first shadow mask than a second portion of the first surface, and the thickness of at least one of the electrodes and intervening layers deposited over the first portion is greater than the thickness of the corresponding electrode or intervening layer deposited over the second portion.

In the first embodiments or any other embodiment, the projection or recess has an aspect ratio of height to width of at least 3:1. In the first embodiments or any other embodiment, the projection or recess is formed by anodization of a substrate material to form nanopores therein, patterned dry anisotropic etching of the substrate, nanowire growth, or folding of thin films.

In the first embodiments or any other embodiment, the first surface includes portions at different levels in cross-sectional view, and a thickness of at least one of the electrodes and intervening layers deposited over one portion of said first surface is substantially the same as a thickness of said at least one of the electrodes and intervening layers deposited over another portion of said first surface.

In the first embodiments or any other embodiment, the method comprises, prior to depositing the first electrode, subjecting the substrate to vacuum, wherein the depositing the first through third electrodes and the first through second intervening layers (and the corresponding displacement of the first shadow mask) are performed while maintaining vacuum conditions.

In the first embodiments or any other embodiment, the depositing the first through third electrodes and the first through second intervening layers (and the corresponding displacement of the first shadow mask) are performed in a single vacuum-based deposition chamber.

In the first embodiments or any other embodiment, during the depositing of at least one of the first through third electrodes and the first through second intervening layers, a portion of the substrate is in contact with the first shadow mask.

In the first embodiments or any other embodiment, the first shadow mask comprises a sealing member surrounding an aperture of the first shadow mask, and the substrate contacts the sealing member during the depositing of at least one of the first through third electrodes and the first through second intervening layers.

In the first embodiments or any other embodiment, during the depositing of at least one of the first through third electrodes and the first through second intervening layers, each part of the first shadow mask is spaced from the substrate. In the first embodiments or any other embodiment, the method comprises, during the depositing of the at least one of the first through third electrodes and the first through second intervening layers, flowing an inert gas along a surface of the first shadow mask.

In the first embodiments or any other embodiment, the method comprises after depositing the third electrode, depositing a third intervening layer over the substrate using the first shadow mask in a sixth position aligned with the fifth position in plan view, and after depositing the third intervening layer, depositing at least a portion of a fourth electrode over the third intervening layer using the first shadow mask in a seventh position aligned with the sixth position in plan view. In the first embodiments or any other embodiment, the second through fourth electrodes may not be in direct contact with each other.

In the first embodiments or any other embodiment, the multi-layer solid-state device comprises a capacitor, each of the first through third electrodes comprises an electrically conductive layer, and each intervening layer comprises a dielectric. In the first embodiments or any other embodiment, the multi-layer solid-state device comprises a solar cell, each of the first through third electrodes comprises an electrically conductive layer, and each intervening layer comprises semiconductor active layers forming a p-n junction. In the first embodiments or any other embodiment, the multi-layer solid-state device comprises a sensor, each of the first through third electrodes comprises an electrically-conductive layer, and each intervening layer comprises a piezoelectric material. In the first embodiments or any other embodiment, the multi-layer solid-state device comprises a light-emitting diode, each of the first through third electrodes comprises an optically-transparent, electrically-conductive layer, and each intervening layer comprises semiconductor active layers forming a p-n junction.

In the first embodiments or any other embodiment, the first shadow mask includes multiple apertures spaced apart from each other, and the depositing of the first through third electrodes and first through second intervening layers forms respective portions of multiple separate multi-layer solid-state batteries on the substrate at a same time using the multiple apertures of the first shadow mask.

In the first embodiments or any other embodiment, the method comprises forming a multi-layer solid-state capacitor on the substrate with a multi-layer solid-state battery.

In the first embodiments or any other embodiment, the substrate comprises an electronic device and a passivation film formed over at least part of the electronic device, the first surface comprises a surface of the passivation film, and the passivation film is between the first electrode and the electronic device along a thickness direction of the solid-state device. In the first embodiments or any other embodiment, the electronic device is a complementary metal-oxide-semiconductor (CMOS) device. In the first embodiments or any other embodiment, the method includes electrically connecting at least one of the first through third electrodes with the electronic device. In the first embodiments or any other embodiment, the electrically connecting comprises forming a via extending through the passivation film and forming a wiring layer in said via, and at least a portion of said wiring layer connects to a portion of at least one of the electrodes.

In the first embodiments or any other embodiment, the method comprises forming a first wiring layer in first and second portions of the first edge region. The first portion of the first edge region extends in a first direction in plan view, the second portion of the first edge region extends in a second direction crossing the first direction in plan view, the first portion of the first edge region is adjacent to a first edge of the first intervening layer in plan view, and the second portion of the first edge region is adjacent to a second edge of the first intervening layer, different from the first edge, in plan view.

In one or more second embodiments, a method comprises forming a first electrode over a substrate, forming a first layer over the first electrode and offset from the first electrode in at least one dimension in plan view, forming a second electrode over the first layer, the second electrode being offset from the first layer and the first electrode in at least one dimension in plan view, forming a second layer over the second electrode, and forming a third electrode over the second layer. A surface of the substrate, over which the first electrode is formed, is non-planar.

In the second embodiments or any other embodiment, in plan view, the first and third electrodes do not overlap with the second electrode, the first layer, and the second layer in a first edge region, and parts of the first and third electrodes are in direct contact with each other in said first edge region.

In the second embodiments or any other embodiment, the method comprises forming a third layer over the third electrode and aligned with the first layer in plan view, and forming a fourth electrode over the third layer. The fourth electrode is aligned with the second electrode in plan view, the second and fourth electrodes do not overlap with the first electrode, the third electrode, and the first through third layers in a second edge region in plan view, and parts of the second and fourth electrodes are in direct contact with each other in said second edge region.

In the second embodiments or any other embodiment, the method comprises forming a first wiring layer in or overlapping with the first edge region in plan view so as to electrically connect to the first and third electrodes, and forming a second wiring layer in or overlapping with the second edge region in plan view so as to electrically connect to the second and fourth electrodes.

In the second embodiments or any other embodiment, the first through third electrodes have the same pattern, and the forming of the first through third electrodes employ the same shadow mask. In the second embodiments or any other embodiment, the first through third electrodes and the first and second layers have the same pattern, and the forming of the first through third electrodes and the first and second layers employ the same shadow mask.

In the second embodiments or any other embodiment, each of the first and third electrodes comprises one of an anode and a cathode of a multi-layer solid-state battery, the second electrode comprises the other of an anode and a cathode of the multi-layer solid-state battery, and each of the first and second layers comprises a solid electrolyte. In the second embodiments or any other embodiment, each of the first through third electrodes comprises a respective current collector layer for electron transport.

In the second embodiments or any other embodiment, the forming the first electrode includes forming a first current collector layer over the substrate, and forming a sublayer of the first electrode over the first current collector layer. In the second embodiments or any other embodiment, forming a sublayer of the second electrode over the first layer, forming a second current collector layer over the sublayer of the second electrode, and forming another sublayer of the second electrode over the second current collector layer. In the second embodiments or any other embodiment, forming a sublayer of the third electrode over the second layer, and depositing a third current collector layer over the sublayer of the third electrode.

In the second embodiments or any other embodiment, the first current collector layer and the sublayer of the first electrode have the same pattern and are aligned with each other in plan view, the second current collector layer and the sublayers of the second electrode have the same pattern and are aligned with each other in plan view, and/or the third current collector layer and the sublayer of the third electrode have the same pattern and are aligned with each other in plan view.

In the second embodiments or any other embodiment, the forming of the first through third current collector layers and the sublayers of the first through third electrodes employ the same shadow mask. In the second embodiments or any other embodiment, the first current collector layer has a pattern different from that of the sublayer of the first electrode, the second current collector layer has a pattern different from that of the sublayers of the second electrode, and/or the third current collector layer has a pattern different from that of the sublayer of the third electrode.

In the second embodiments or any other embodiment, each of the first through third electrodes comprises an upper sublayer, a current collector layer for electron transport, and a lower sublayer, and the current collector layer is disposed between the upper and lower sublayers in cross-sectional view.

In the second embodiments or any other embodiment, the first layer is offset from the first electrode in at least two orthogonal dimensions in plan view, and/or the second electrode is offset from the first layer and the first electrode in at least two orthogonal dimensions in plan view.

In the second embodiments or any other embodiment, each of first through third electrodes and the first and second layers are formed over respective three-dimensional features formed on the substrate. In the second embodiments or any other embodiment, each of first through third electrodes and the first and second layers are formed over respective three-dimensional features of the substrate, so as to conform or follow a cross-sectional profile of the three-dimensional features.

In the second embodiments or any other embodiment, the three-dimensional features comprise an electronic device separated from the first electrode by at least a passivation film. In the second embodiments or any other embodiment, said three-dimensional features include at least one of a projection and a recess.

In the second embodiments or any other embodiment, an aspect ratio of height to width of the three-dimensional features is less than 5:1, and the forming of at least one of first through third electrodes and first and second layers comprises a physical vapor deposition or physical liquid deposition technique.

In the second embodiments or any other embodiment, an aspect ratio of height to width of said three-dimensional features is at least 3:1, and the forming of at least one of first through third electrodes and first and second layers comprises a chemical deposition technique.

In the second embodiments or any other embodiment, thicknesses of each of the first through third electrodes and the first and second layers over one portion of the substrate are different from the thicknesses of each of the first through third electrodes and the first and second layers, respectively, over another portion of the substrate.

In the second embodiments or any other embodiment, the forming of at least one of the first through third electrodes and first and second layers comprises at least one of vacuum deposition and sol-gel application. In the second embodiments or any other embodiment, the forming of the first through third electrodes and first and second layers are performed under a continuous vacuum. In the second embodiments or any other embodiment, at least a portion of the non-planar surface of the substrate has a non-zero curvature in cross-sectional view.

In the second embodiments or any other embodiment, each of the first through third electrodes comprises an electrically conductive layer of a multi-layer capacitor, and each of the first and second layers comprises a dielectric. In the second embodiments or any other embodiment, each of the first through third electrodes comprises an electrically conductive layer of a multi-layer solar cell, and each of the first and second layers comprises semiconductor active layers forming a p-n junction. In the second embodiments or any other embodiment, each of the first through third electrodes comprises an electrically conductive layer of a multi-layer sensor, and each of the first and second layers comprises a piezo-electric material. In the second embodiments or any other embodiment, each of the first through third electrodes comprises an electrically conductive layer of a multi-layer light-emitting diode, and each of the first and second layers comprises semiconductor active layers forming a p-n junction.

In one or more third embodiments, a multi-layer solid-state device is fabricated by the method of any of the first and second embodiments. In the third embodiments or any other embodiment, the solid-state device includes at least one of a multi-layer battery, a multi-layer sensor, a multi-layer light-emitting diode, a multi-layer solar cell, or a multi-layer capacitor.

In one or more fourth embodiments, a multi-layer solid-state device comprises a substrate, first through third electrodes, and first through second intervening layers. The substrate has a non-planar surface. The first electrode is formed over the non-planar surface of the substrate. The first intervening layer is formed over the first electrode. The second electrode is formed over the first intervening layer. The second intervening layer is formed over the second electrode. The third electrode is formed over the second intervening layer. In plan view, the first electrode is aligned with the third electrode, the first intervening layer is aligned with the second intervening layer, the first and third electrodes are offset in at least one dimension from the first and second intervening layers, and the second electrode is offset in at least one dimension from the first and third electrodes and from the first and second intervening layers.

In the fourth embodiments or any other embodiment, parts of the first and third electrodes are in direct contact with each other in a first edge region that does not overlap with the second electrode and the first and second intervening layers in plan view, and each intervening layer is spaced from the first edge region.

In the fourth embodiments or any other embodiment, the solid-state device comprises a third intervening layer formed over the third electrode, and a fourth electrode formed over the third intervening layer. In the fourth embodiments or any other embodiment, in plan view, the fourth electrode is aligned with the second electrode, the third intervening layer is aligned with the first intervening layer, the second and fourth electrodes are offset in at least one dimension from the first and third electrodes and from the first through third intervening layers, and parts of the second and fourth electrodes are in direct contact with each other in a second edge region that does not overlap with the first and third electrodes and the first through third intervening layers.

In the fourth embodiments or any other embodiment, the solid-state device comprises a first wiring layer formed on an uppermost electrode in the first edge region, the first wiring layer being electrically connected to the first and third electrodes, and a second wiring layer formed on an uppermost electrode in the second edge region, the second wiring layer being electrically connected to the second and fourth electrodes.

In the fourth embodiments or any other embodiment, the solid-state device comprises a first wiring layer formed in direct contact with respective edges of the first and third electrodes in the first edge region, the first wiring layer being electrically connected to the first and third electrodes, and a second wiring layer formed in direct contact with respective edges of the second and fourth electrodes, the second wiring layer being electrically connected to the second and fourth electrodes.

In the fourth embodiments or any other embodiment, the first wiring layer and the second wiring layer are on opposite sides of the first intervening layer in plan view.

In the fourth embodiments or any other embodiment, the solid-state device comprises a housing with a pair of contact terminals. In the fourth embodiments or any other embodiment, the first wiring layer connects to one of the contact terminals and the second wiring layer connects to another of the contact terminals.

In the fourth embodiments or any other embodiment, the device is constructed as a battery, each of the first and third electrodes comprises one of an anode and a cathode, the second electrode comprises the other of an anode and a cathode, and each intervening layer comprises a solid electrolyte.

In the fourth embodiments or any other embodiment, each of the first through third electrodes comprises a respective current collector layer for electron transport. In the fourth embodiments or any other embodiment, the first electrode comprises a first electrode layer disposed over a first current collector layer, the second electrode comprises a second current collector layer disposed between a second electrode layer and a third electrode layer in a thickness direction, and the third electrode comprises a third current collector layer disposed over a fourth electrode layer. In the fourth embodiments or any other embodiment, the third electrode comprises a fifth electrode layer over the third current collector layer, such that the third current collector layer is between the fourth and fifth electrode layers in the thickness direction.

In the fourth embodiments or any other embodiment, each of the first through electrodes comprises an upper electrode layer, a current collector layer for electron transport, and a lower electrode layer, and the current collector layer is disposed between the upper and lower electrode layers in cross-sectional view.

In the fourth embodiments or any other embodiment, the first electrode, the second electrode, and the third electrode have a same shape in plan view. In the fourth embodiments or any other embodiment, the first electrode, the second electrode, the third electrode, the first intervening layer, and the second intervening layer have the same shape in plan view. In the fourth embodiments or any other embodiment, the shape of the first electrode is non-rectangular or irregular.

In the fourth embodiments or any other embodiment, in plan view, the first and third electrodes are offset in two orthogonal dimensions from the first and second intervening layers, and the second electrode is offset in two orthogonal dimensions from the first and third electrodes and from the first and second intervening layers.

In the fourth embodiments or any other embodiment, the substrate has at least one protrusion or at least one recess that define said non-planar surface, and the first through third electrodes and the first through second intervening layers are formed over surfaces of the at least one protrusion or at least one recess. In the fourth embodiments or any other embodiment, the at least one protrusion or at least one recess has an aspect ratio of height to width of at least 0.5:1. In the fourth embodiments or any other embodiment, the at least one protrusion or at least one recess has an aspect ratio of height to width of at least 3:1. In the fourth embodiments or any other embodiment, the substrate has multiple protrusions and/or recesses, and the first through third electrodes and the first through second intervening layers are formed over surfaces of each protrusion and/or recess.

In the fourth embodiments or any other embodiment, thicknesses of the first through third electrodes and the first through second intervening layers at a top surface of the protrusion or at a bottom surface of the recess are different from corresponding thicknesses of the first through third electrodes and the first through second intervening layers on a surface of the substrate adjacent to said protrusion or recess. In the fourth embodiments or any other embodiment, thicknesses of the first through third electrodes and the first through second intervening layers at a top surface of the protrusion or at a bottom surface of the recess are substantially the same as corresponding thicknesses of the first through third electrodes and the first through second intervening layers on a surface of the substrate adjacent to said protrusion or recess.

In the fourth embodiments or any other embodiment, the device is constructed as a capacitor, each of the first through third electrodes comprises an electrically conductive layer, and each intervening layer comprises a dielectric. In the fourth embodiments or any other embodiment, the device is constructed as one of a solar cell and a light-emitting diode, each of the first through third electrodes comprises an electrically conductive layer, and each intervening layer comprises semiconductor active layers forming a p-n junction. In the fourth embodiments or any other embodiment, the device is constructed as a sensor, each of the first through third electrodes comprises an electrically-conductive layer, and each intervening layer comprises a piezo-electric material.

In the fourth embodiments or any other embodiment, the substrate comprises a 3-D scaffold with numerous surface features over which the first electrode is formed. In the fourth embodiments or any other embodiment, the substrate comprises a semiconductor substrate. In the fourth embodiments or any other embodiment, the substrate comprises a shaped metal foil. In the fourth embodiments or any other embodiment, the shaped metal foil is a convoluted aluminum foil. In the fourth embodiments or any other embodiment, the substrate comprises another electrode of the device.

In the fourth embodiments or any other embodiment, the substrate comprises an electronic device. In the fourth embodiments or any other embodiment, the electronic device is electrically connected to at least one of the first through third electrodes. In the fourth embodiments or any other embodiment, the electronic device comprises a complementary metal-oxide-semiconductor (CMOS) device. In the fourth embodiments or any other embodiment, the substrate includes a passivation film disposed between the electronic device and the first electrode in cross-sectional view. In the fourth embodiments or any other embodiment, a wiring layer extends through the passivation film to electrically connect the electronic device with at least one of the first through third electrodes.

In one or more fifth embodiments, a system comprises multiple multi-layer solid-state batteries according to any of the third and fourth embodiments, or formed according to the method of any of the first and second embodiments. Each of the batteries can be formed on a common substrate, and at least some of the batteries being electrically connected together in series, in parallel, or in combinations of series and parallel.

In the fifth embodiments or any other embodiment, the system comprises a power management chip disposed on the common substrate and configured to control operation of the batteries. In the fifth embodiments or any other embodiment, the system comprises at least one electronic device formed on the common substrate.

In the fifth embodiments or any other embodiment, the system comprises at least one of a multi-layer solid-state capacitor formed on the common substrate, a multi-layer sensor formed on the common substrate, a multi-layer solar cell formed on the common substrate, and a multi-layer light-emitting diode formed on the common substrate. In the fifth embodiments or any other embodiment, said multi-layer solid-state capacitor, said multi-layer sensor, said multi-layer solar cell, or said multi-layer light-emitting diode can be according to any of the third and fourth embodiments, or formed according to the method of any of the first and second embodiments It will be appreciated that the aspects of the disclosed subject matter, for example, control of the deposition process to form the multi-layer solid-state device, can be implemented, fully or partially, in hardware, hardware programmed by software, software instruction stored on a computer readable medium (e.g., a non-transitory computer readable medium), or any combination of the above.

For example, components of the disclosed subject matter, including components such as a control unit, controller, processor, or any other feature, can include, but are not limited to, a personal computer or workstation or other such computing system that includes a processor, microprocessor, microcontroller device, or is comprised of control logic including integrated circuits such as, for example, an application specific integrated circuit (ASIC).

Features discussed herein can be performed on a single or distributed processor (single and/or multi-core), by components distributed across multiple computers or systems, or by components co-located in a single processor or system. For example, aspects of the disclosed subject matter can be implemented via a programmed general purpose computer, an integrated circuit device, (e.g., ASIC), a digital signal processor (DSP), an electronic device programmed with microcode (e.g., a microprocessor or microcontroller), a hard-wired electronic or logic circuit, a programmable logic circuit (e.g., programmable logic device (PLD), programmable logic array (PLA), field-programmable gate array (FPGA), programmable array logic (PAL)), software stored on a computer-readable medium or signal, an optical computing device, a networked system of electronic and/or optical devices, a special purpose computing device, a semiconductor chip, a software module or object stored on a computer-readable medium or signal.

When implemented in software, functions may be stored on or transmitted over as one or more instructions or code on a computer-readable medium. The steps of a method or algorithm disclosed herein may be embodied in a processor-executable software module, which may reside on a computer-readable medium. Instructions can be compiled from source code instructions provided in accordance with a programming language. The sequence of programmed instructions and data associated therewith can be stored in a computer-readable medium (e.g., a non-transitory computer readable medium), such as a computer memory or storage device, which can be any suitable memory apparatus, such as, but not limited to read-only memory (ROM), programmable read-only memory (PROM), electrically erasable programmable read-only memory (EEPROM), random-access memory (RAM), flash memory, disk drive, etc.

As used herein, computer-readable media includes both computer storage media and communication media, including any medium that facilitates the transfer of a computer program from one place to another. Thus, a storage media may be any available media that may be accessed by a computer. By way of example, and not limitation, such computer-readable media may comprise RAM, ROM, EEPROM, CD-ROM or other optical disk storage, magnetic disk storage or other magnetic storage devices, or any other medium that may be used to carry or store desired program code in the form of instructions or data structures and that may be accessed by a computer.

Also, any connection is properly termed a computer-readable medium. For example, if the software is transmitted from a website, server, or other remote source using a transmission medium (e.g., coaxial cable, fiber optic cable, twisted pair, digital subscriber line (DSL), or wireless technologies such as infrared, radio, and microwave), then the transmission medium is included in the definition of computer-readable medium. Moreover, the operations of a method or algorithm may reside as one of (or any combination of) or a set of codes and/or instructions on a machine-readable medium and/or computer-readable medium, which may be incorporated into a computer program product.

One of ordinary skill in the art will readily appreciate that the above description is not exhaustive, and that aspects of the disclosed subject matter may be implemented other than as specifically disclosed above. Indeed, embodiments of the disclosed subject matter can be implemented in hardware and/or software using any known or later developed systems, structures, devices, and/or software by those of ordinary skill in the applicable art from the functional description provided herein.

In this application, unless specifically stated otherwise, the use of the singular includes the plural, and the separate use of "or" and "and" includes the other, i.e., "and/or." Furthermore, use of the terms "including" or "having," as well as other forms such as "includes," "included," "has," or "had," are intended to have the same effect as "comprising" and thus should not be understood as limiting.

Any range described herein will be understood to include the endpoints and all values between the endpoints. Whenever "substantially," "approximately," "essentially," "near," or similar language is used in combination with a specific value, variations up to and including 10% of that value are intended, unless explicitly stated otherwise.

It is thus apparent that there is provided, in accordance with the present disclosure, multi-layer solid-state devices and methods for forming the same. Many alternatives, modifications, and variations are enabled by the present disclosure. While specific examples have been shown and described in detail to illustrate the application of the principles of the present invention, it will be understood that the invention may be embodied otherwise without departing from such principles. For example, disclosed features may be combined, rearranged, omitted, etc. to produce additional embodiments, while certain disclosed features may sometimes be used to advantage without a corresponding use of other features. Accordingly, Applicant intends to embrace all such alternative, modifications, equivalents, and variations that are within the spirit and scope of the present invention.

The invention claimed is:

1. A multi-layer solid-state device comprising:
a substrate with a non-planar surface;
a first electrode formed over the non-planar surface of the substrate;
a first intervening layer formed over the first electrode;
a second electrode formed over the first intervening layer;
a second intervening layer formed over the second electrode; and
a third electrode formed over the second intervening layer,
wherein, in plan view:
the first electrode is aligned with the third electrode;
the first intervening layer is aligned with the second intervening layer;
the first and third electrodes are offset in at least one dimension from the first and second intervening layers; and
the second electrode is offset in at least one dimension from the first and third electrodes and from the first and second intervening layers, and
wherein:
parts of the first and third electrodes are in direct contact with each other in a first edge region that does not overlap with the second electrode and the first and second intervening layers in plan view, and
each intervening layer is spaced from the first edge region.

2. The device of claim 1, wherein:
the device is constructed as a battery;
each of the first and third electrodes comprises one of an anode and a cathode;
the second electrode comprises the other of an anode and a cathode; and
each intervening layer comprises a solid electrolyte.

3. The device of claim 1, wherein each of the first through third electrodes comprises an upper electrode layer, a current collector layer for electron transport, and a lower electrode layer, and the current collector layer is disposed between the upper and lower electrode layers in cross-sectional view.

4. The device of claim 1, wherein:
the substrate has at least one protrusion or at least one recess that define said non-planar surface, and the first through third electrodes and the first through second intervening layers are formed over surfaces of the at least one protrusion or at least one recess.

5. The device of claim 2, wherein each of the first through third electrodes comprises a respective current collector layer for electron transport.

6. The device of claim 5, wherein:
the first electrode comprises a first electrode layer disposed over a first current collector layer;
the second electrode comprises a second current collector layer disposed between a second electrode layer and a third electrode layer in a thickness direction; and
the third electrode comprises a third current collector layer disposed over a fourth electrode layer.

7. The device of claim 1, wherein the first electrode, the second electrode, and the third electrode have a same shape in plan view.

8. The device of claim 7, wherein the first electrode, the second electrode, the third electrode, the first intervening layer, and the second intervening layer have the same shape in plan view.

9. The device of claim 7, wherein the shape of the first electrode is non-rectangular or irregular.

10. The device of claim 1, wherein, in plan view:
the first and third electrodes are offset in two orthogonal dimensions from the first and second intervening layers; and
the second electrode is offset in two orthogonal dimensions from the first and third electrodes and from the first and second intervening layers.

11. The device of claim 4, wherein the at least one protrusion or at least one recess has an aspect ratio of height to width of at least 0.5:1.

12. The device of claim 11, wherein the at least one protrusion or at least one recess has an aspect ratio of height to width of at least 3:1.

13. The device of claim 4, wherein the substrate has multiple protrusions and/or recesses, and the first through third electrodes and the first through second intervening layers are formed over surfaces of each protrusion and/or recess.

14. The device of claim 4, wherein thicknesses of the first through third electrodes and the first through second intervening layers at a top surface of the protrusion or at a bottom surface of the recess are different from corresponding thicknesses of the first through third electrodes and the first through second intervening layers on a surface of the substrate adjacent to said protrusion or recess.

15. The device of claim 4, wherein thicknesses of the first through third electrodes and the first through second intervening layers at a top surface of the protrusion or at a bottom surface of the recess are substantially the same as corresponding thicknesses of the first through third electrodes and the first through second intervening layers on a surface of the substrate adjacent to said protrusion or recess.

16. The device of claim 1, wherein:
the device is constructed as a capacitor;
each of the first through third electrodes comprises an electrically conductive layer; and
each intervening layer comprises a dielectric.

17. The device of claim 1, wherein:
the device is constructed as one of a solar cell and a light-emitting diode;
each of the first through third electrodes comprises an electrically conductive layer; and
each intervening layer comprises semiconductor active layers forming a p-n junction.

18. The device of claim 1, wherein:
the device is constructed as a sensor;
each of the first through third electrodes comprises an electrically conductive layer; and
each intervening layer comprises a piezo-electric material.

19. A multi-layer solid-state device comprising:
a substrate with a non-planar surface;
a first electrode formed over the non-planar surface of the substrate;
a first intervening layer formed over the first electrode;
a second electrode formed over the first intervening layer;
a second intervening layer formed over the second electrode; and
a third electrode formed over the second intervening layer,
wherein, in plan view:
the first electrode is aligned with the third electrode;
the first intervening layer is aligned with the second intervening layer;
the first and third electrodes are offset in at least one dimension from the first and second intervening layers; and
the second electrode is offset in at least one dimension from the first and third electrodes and from the first and second intervening layers, and
wherein the substrate comprises a 3-D scaffold with numerous surface features over which the first electrode is formed.

20. The device of claim 19, wherein:
the device is constructed as a battery;
each of the first and third electrodes comprises one of an anode and a cathode;
the second electrode comprises the other of an anode and a cathode; and
each intervening layer comprises a solid electrolyte.

21. The device of claim 20, wherein each of the first through third electrodes comprises a respective current collector layer for electron transport.

22. The device of claim 21, wherein:
the first electrode comprises a first electrode layer disposed over a first current collector layer;
the second electrode comprises a second current collector layer disposed between a second electrode layer and a third electrode layer in a thickness direction; and
the third electrode comprises a third current collector layer disposed over a fourth electrode layer.

23. The device of claim 19, wherein each of the first through third electrodes comprises an upper electrode layer, a current collector layer for electron transport, and a lower electrode layer, and the current collector layer is disposed between the upper and lower electrode layers in cross-sectional view.

24. The device of claim 19, wherein:
the substrate has at least one protrusion or at least one recess that define said non-planar surface, and
the first through third electrodes and the first through second intervening layers are formed over surfaces of the at least one protrusion or at least one recess.

25. The device of claim 24, wherein the at least one protrusion or at least one recess has an aspect ratio of height to width of at least 0.5:1.

26. The device of claim 25, wherein the at least one protrusion or at least one recess has an aspect ratio of height to width of at least 3:1.

27. The device of claim 24, wherein the substrate has multiple protrusions and/or recesses, and the first through third electrodes and the first through second intervening layers are formed over surfaces of each protrusion and/or recess.

28. The device of claim 24, wherein thicknesses of the first through third electrodes and the first through second intervening layers at a top surface of the protrusion or at a bottom surface of the recess are different from corresponding thicknesses of the first through third electrodes and the first through second intervening layers on a surface of the substrate adjacent to said protrusion or recess.

29. The device of claim 24, wherein thicknesses of the first through third electrodes and the first through second intervening layers at a top surface of the protrusion or at a bottom surface of the recess are substantially the same as corresponding thicknesses of the first through third electrodes and the first through second intervening layers on a surface of the substrate adjacent to said protrusion or recess.

30. The device of claim 19, wherein the first electrode, the second electrode, and the third electrode have a same shape in plan view.

31. The device of claim 30, wherein the first electrode, the second electrode, the third electrode, the first intervening layer, and the second intervening layer have the same shape in plan view.

32. The device of claim 30, wherein the shape of the first electrode is non-rectangular or irregular.

33. The device of claim 19, wherein, in plan view:
the first and third electrodes are offset in two orthogonal dimensions from the first and second intervening layers; and
the second electrode is offset in two orthogonal dimensions from the first and third electrodes and from the first and second intervening layers.

34. The device of claim 19, wherein:
the device is constructed as a capacitor;
each of the first through third electrodes comprises an electrically conductive layer; and
each intervening layer comprises a dielectric.

35. The device of claim 19, wherein:
the device is constructed as one of a solar cell and a light-emitting diode;
each of the first through third electrodes comprises an electrically conductive layer; and
each intervening layer comprises semiconductor active layers forming a p-n junction.

36. The device of claim 19, wherein:
the device is constructed as a sensor;
each of the first through third electrodes comprises an electrically conductive layer; and
each intervening layer comprises a piezo-electric material.

* * * * *